(12) United States Patent
Horio et al.

(10) Patent No.: US 11,856,296 B2
(45) Date of Patent: Dec. 26, 2023

(54) SHAKE CORRECTION UNIT, OPTICAL UNIT, AND SMARTPHONE

(71) Applicant: NIDEC CORPORATION, Kyoto (JP)

(72) Inventors: Naofumi Horio, Kyoto (JP); Soichiro Kimura, Kyoto (JP); Shinri Ono, Kyoto (JP); Kazuhiro Sazai, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 0 days.

(21) Appl. No.: 17/679,094

(22) Filed: Feb. 24, 2022

(65) Prior Publication Data

US 2022/0272264 A1    Aug. 25, 2022

(30) Foreign Application Priority Data

Feb. 25, 2021   (JP) ................................ 2021-029217

(51) Int. Cl.
| | |
|---|---|
| H04N 23/68 | (2023.01) |
| H05K 1/02 | (2006.01) |
| H05K 1/14 | (2006.01) |
| H04N 23/54 | (2023.01) |
| H04M 1/02 | (2006.01) |

(Continued)

(52) U.S. Cl.
CPC .......... *H04N 23/687* (2023.01); *H04N 23/54* (2023.01); *H05K 1/0274* (2013.01); *H05K 1/14* (2013.01); *H01F 7/02* (2013.01); *H01F 7/06* (2013.01); *H04M 1/0202* (2013.01); *H05K 2201/10121* (2013.01)

(58) Field of Classification Search
CPC ...... H04N 23/687; H04N 23/54; H04N 23/57; H04N 23/40; H05K 1/0274; H05K 1/14; H05K 2201/10121; H05K 1/028; H05K 1/189; H01F 7/02; H01F 7/06; H04M 1/0202; H04M 1/0264; H04M 1/0277; H04M 2250/20; G03B 5/00; G03B 30/00
See application file for complete search history.

(56) References Cited

U.S. PATENT DOCUMENTS

2007/0077805 A1\* 4/2007 Nomura ................ H04N 23/68
                                                           348/E5.046
2009/0126976 A1\* 5/2009 Iida ........................ H05K 1/028
                                                           29/829

(Continued)

FOREIGN PATENT DOCUMENTS

| CN | 111665677 A | 9/2020 |
|---|---|---|
| CN | 111683454 A | 9/2020 |

(Continued)

*Primary Examiner* — Jason A Flohre
(74) *Attorney, Agent, or Firm* — HAUPTMAN HAM, LLP

(57) ABSTRACT

In a shake correction unit, a first circuit board has a first portion extending from a first side to a second side in a direction, a second portion extending from the second side to the first side in the direction, and a bent portion in which an end portion on the second side of the second portion is bent with respect to an end portion on the second side of the first portion. A second circuit board has a first portion extending from the second side to the first side in the direction, a second portion extending from the first side to the second side in the direction, and a bent portion in which an end portion on the first side of the second portion is bent with respect to an end portion on the first side of the first portion.

18 Claims, 22 Drawing Sheets

(51) Int. Cl.
    *H01F 7/02*     (2006.01)
    *H01F 7/06*     (2006.01)

(56) References Cited

U.S. PATENT DOCUMENTS

| | | | | |
|---|---|---|---|---|
| 2020/0012068 A1* | 1/2020 | Lim | .................. | H05K 1/181 |
| 2020/0196447 A1* | 6/2020 | Mak | .................. | H04N 23/687 |
| 2021/0084764 A1* | 3/2021 | Yang | .................. | H05K 1/189 |
| 2021/0223661 A1 | 7/2021 | Minamisawa et al. | | |
| 2022/0329712 A1* | 10/2022 | Wang | .................. | H04N 23/687 |

FOREIGN PATENT DOCUMENTS

| | | |
|---|---|---|
| CN | 212936006 U | 4/2021 |
| JP | 200793953 A | 4/2007 |
| JP | 200910259 A | 1/2009 |
| JP | 202086367 A | 6/2020 |

\* cited by examiner

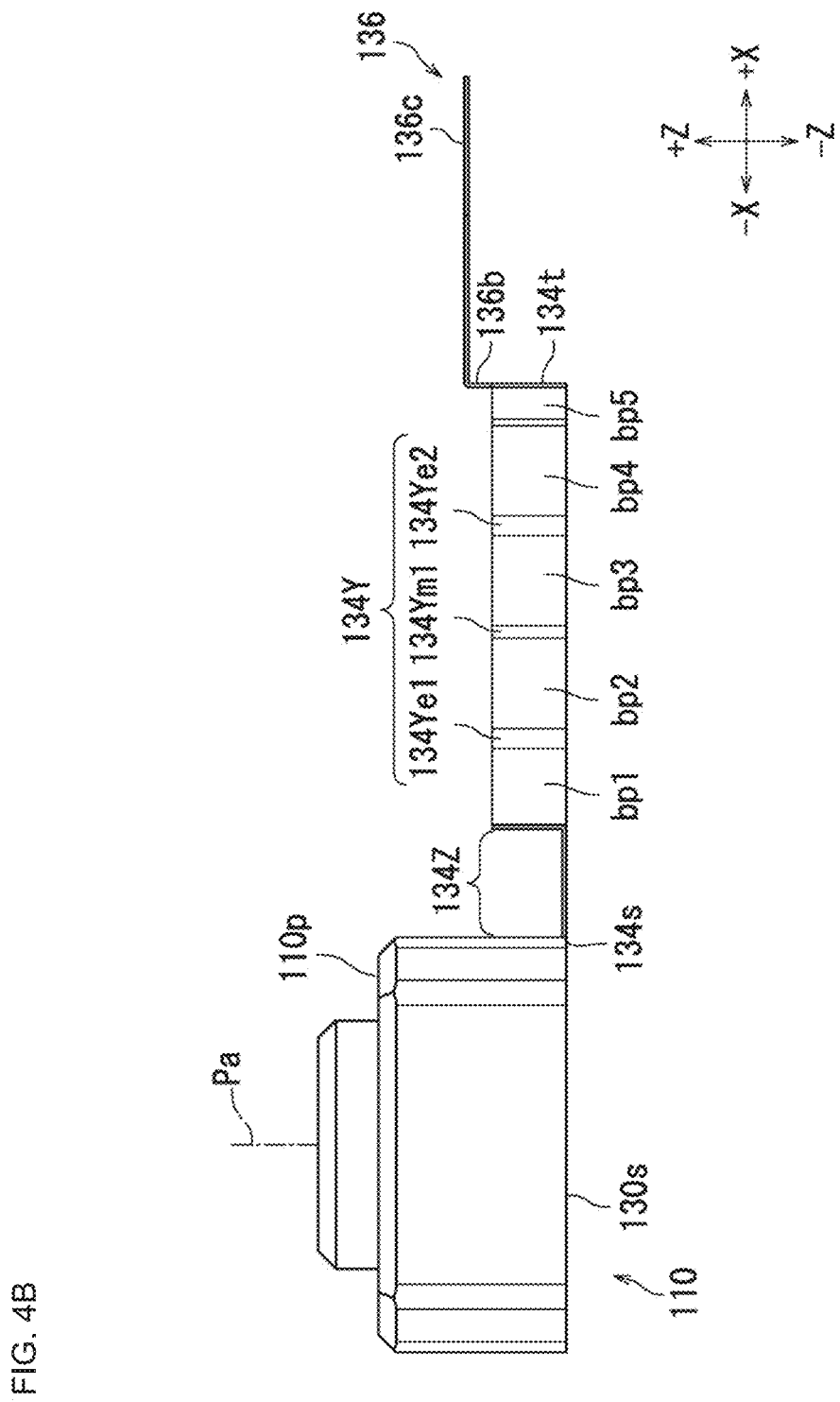

SHAKE CORRECTION UNIT, OPTICAL UNIT, AND SMARTPHONE

CROSS-REFERENCE TO RELATED APPLICATIONS

The present invention claims priority under 35 U.S.C. § 119 to Japanese Patent Application No. 2021-029217 filed on Feb. 25, 2021, the entire content of which is incorporated herein by reference.

FIELD OF THE INVENTION

The present invention relates to a shake correction unit, an optical unit, and a smartphone.

BACKGROUND

An image blur sometimes occurs due to camera shake during capturing a still image or moving image with a camera. For this reason, an image stabilization device has been put into practical use to enable clear imaging with image blur prevention. When the camera shakes, the image stabilization device can remove image blur by correcting the position and orientation of a camera module according to the shake.

Absorbing the stress of an external force due to camera shake with a flexible substrate has been studied. In a conventional camera shake correction unit, a second surface orthogonal to a first surface to which a CCD is attached is connected, and a flexible substrate for fixing a third surface orthogonal to the second surface is mounted to absorb the stress of an external force that accompanies a camera shake.

However, even in the conventional camera shake correction unit, elastic resistance of a circuit board becomes relatively high, and excessive power may be required for driving. In particular, when the CCD rotates about an optical axis, the elastic resistance of the flexible substrate may become high.

SUMMARY

An exemplary shake correction unit according to an aspect of the present invention corrects a shake of an optical module having at least an imaging element. The shake correction unit includes a movable body, a fixed body that movably supports the movable body, and a circuit board connected to the movable body. The movable body is rotatable about at least a first rotation axis extending in a first direction, the circuit board includes a first circuit board and a second circuit board, and the first circuit board has a first end portion connected to the movable body on a first side in a second direction orthogonal to the first direction with respect to the movable body, and a second end portion that is connected to the fixed body. The second circuit board has a first end portion connected to the movable body on the first side in the second direction with respect to the movable body, and a second end portion that is connected to the fixed body. The first circuit board has a first portion extending from a first side in a third direction orthogonal to each of the first direction and the second direction to a second side in the third direction, a second portion extending from the second side in the third direction to the first side in the third direction, and a third direction bent portion in which an end portion on the second side in the third direction of the second portion is bent in the third direction with respect to an end portion on the first side in the third direction of the first portion. The second circuit board has a first portion extending from the second side in the third direction to the first side in the third direction, a second portion extending from the first side in the third direction to the second side in the third direction, and a third direction bent portion in which an end portion on the first side in the third direction of the second portion is bent in the third direction with respect to an end portion on the first side in the third direction of the first portion.

An exemplary shake correction unit according to another aspect of the present invention is a shake correction unit that corrects a shake of an optical module having at least an imaging element, and includes a movable body, a fixed body that movably supports the movable body, and a circuit board connected to the movable body. The movable body is rotatable about at least a first rotation axis extending in a first direction, the circuit board includes a first circuit board and a second circuit board, and the first circuit board has a first direction extended first portion extending from a first side in the first direction to a second side in the first direction, a first direction extended second portion extending from the second side in the first direction to the first side in the first direction, and a first direction bent portion connected to each of an end portion on the second side in the first direction of the first direction extended first portion and an end portion on the second side in the first direction of the first direction extended second portion. The second circuit board has a first direction extended first portion extending from the first side in the first direction to the second side in the first direction, a first direction extended second portion extending from the second side in the first direction to the first side in the first direction, and a first direction bent portion connected to each of an end portion on the second side in the first direction of the first direction extended first portion and an end portion on the second side in the first direction of the first direction extended second portion.

An exemplary optical unit according to yet another aspect of the present invention includes the shake correction unit described in any of the above and the optical module.

An exemplary smartphone according to yet another aspect of the present invention includes the optical unit described above.

The above and other elements, features, steps, characteristics and advantages of the present disclosure will become more apparent from the following detailed description of the preferred embodiments with reference to the attached drawings.

BRIEF DESCRIPTION OF THE DRAWINGS

FIG. 4B is a schematic side view of the circuit board and the optical module in the shake correction unit of the present embodiment;

DETAILED DESCRIPTION

Figure 1:
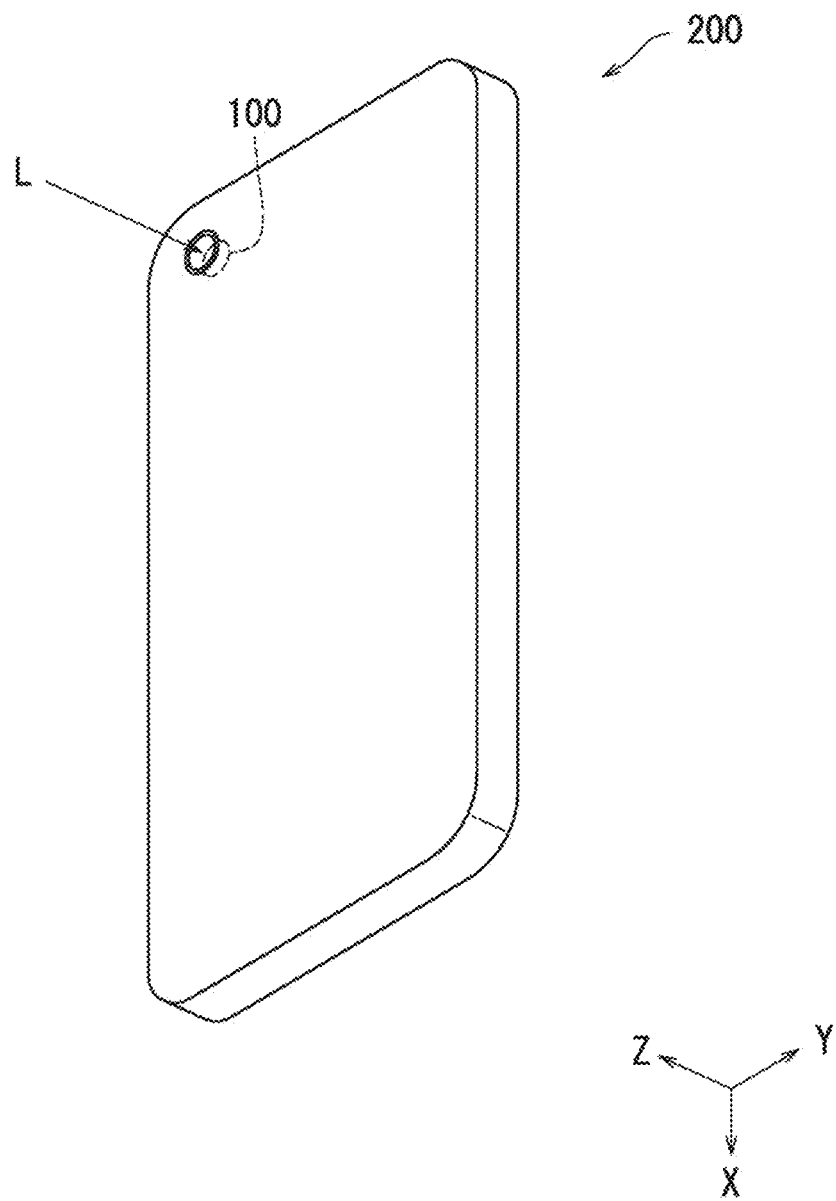
FIG. 1 is a schematic perspective view of a smartphone including an optical unit of the present embodiment.

Hereinafter, an exemplary embodiment of a shake correction unit, an optical unit, and a smartphone according to the present invention will be described with reference to the drawings. Note that in the drawings, the same or corresponding parts will be denoted by the same reference symbols and description of such parts will not be repeated. Note that in the description of the present application, an X-axis, a Y-axis, and a Z-axis that are orthogonal to one another may be used to facilitate understanding of the invention. Here, it should be noted that the X-axis, the Y-axis, and the Z-axis do not limit the orientation of the optical unit during use. Further, in the description of the present application, the Z-axis direction may be described as a first direction, the X-axis direction may be described as a second direction, and the Y-axis direction may be described as a third direction. It should be noted that the relationships between the X-axis, Y-axis, and Z-axis directions and the first to third directions are not limited to the above.

An optical unit of the present embodiment is suitably used as an optical component of a smartphone.

First, a smartphone 200 including an optical unit 100 of the present embodiment will be described with reference to FIG. 1. FIG. 1 is a schematic perspective view of the smartphone 200 including the optical unit 100 of the present embodiment.

As illustrated in FIG. 1, the smartphone 200 includes the optical unit 100 of the present embodiment. The optical unit 100 is incorporated in the smartphone 200 as an example. Light L enters the smartphone 200 from the outside through the optical unit 100, and a subject image is captured on the basis of the light that enters the optical unit 100. The optical unit 100 is used to correct blur of the captured image when the smartphone 200 shakes. Note that the optical unit 100 may include an imaging element, and the optical unit 100 may include an optical member that transmits light to the imaging element.

The optical unit 100 is preferably manufactured in a small size. In this manner, the smartphone 200 itself can be downsized, or another component can be incorporated in the smartphone 200 without upsizing the smartphone 200.

Note that the application of the optical unit 100 is not limited to the smartphone 200, and the optical unit 100 can be used in various devices such as cameras and videos without particular limitation. For example, the optical unit 100 may be incorporated in, for example, an imaging device such as a mobile phone with a camera or a drive recorder, or an action camera and a wearable camera incorporated in a moving body such as a helmet, a bicycle, or a radio-controlled helicopter.

Figure 2:
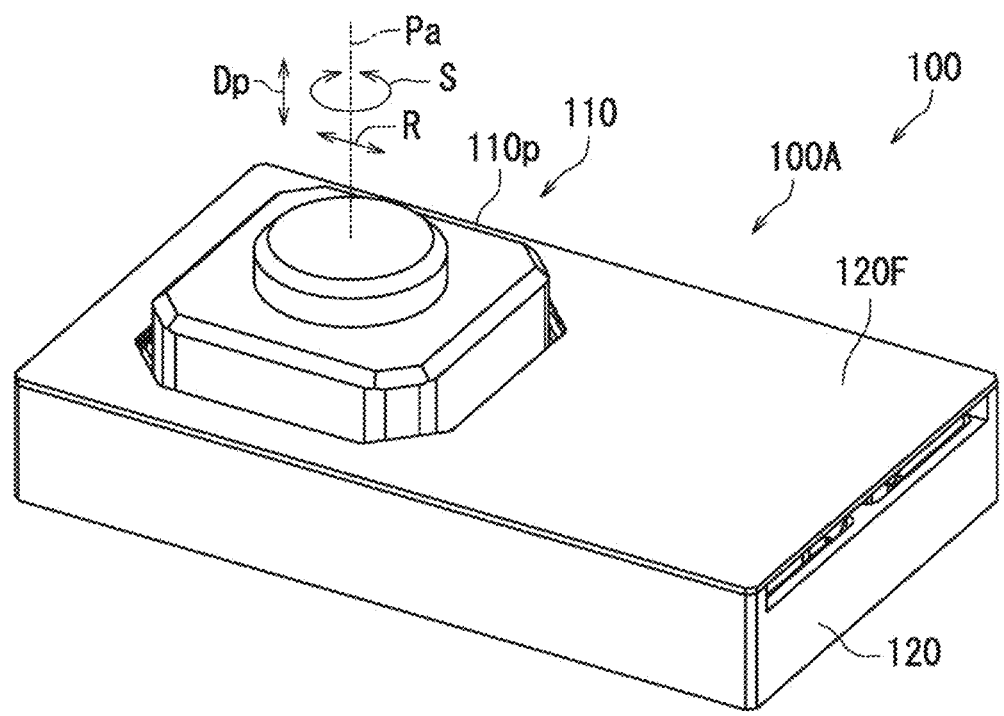
FIG. 2 is a schematic perspective view of the optical unit of the present embodiment.

Next, the optical unit 100 according to the present embodiment will be described with reference to FIGS. 1 and 2. FIG. 2 is a schematic perspective view of the optical unit 100 of the present embodiment.

As illustrated in FIG. 2, the optical unit 100 includes a shake correction unit 100A and an optical module 110p. The shake correction unit 100A includes a movable body 110, a fixed body 120, and a lid 120F. The optical module 110p is mounted on the movable body 110. Here, the fixed body 120 is covered with the lid 120F. The shake correction unit 100A corrects a shake of the optical module 110p having at least an imaging element.

The optical module 110p has an optical axis Pa. The optical axis Pa extends in the Z direction from the center of the surface on the +Z direction side of the optical module 110p. Light along the optical axis Pa enters the optical module 110p. A light incident surface of the optical module 110p is arranged on the surface on the +Z direction side of the optical module 110p. The optical axis Pa extends in the normal direction with respect to the light incident surface. The optical axis Pa extends in an optical axis direction Dp. The optical axis direction Dp is parallel to the normal line of the light incident surface of the optical module 110p.

The direction orthogonal to the optical axis direction Dp is a direction intersecting the optical axis Pa and perpendicular to the optical axis Pa. In the present description, a direction orthogonal to the optical axis Pa may be referred to as a "radial direction". Of the radial directions, radially outward indicates a direction away from the optical axis Pa. In FIG. 2, a reference sign R indicates an example of the radial direction. Further, a direction of rotation about the optical axis Pa may be referred to as a "circumferential direction". In FIG. 2, a reference sign S indicates the circumferential direction.

When the movable body 110 and the optical module 110p are inserted into the fixed body 120 and the movable body 110 is mounted on the fixed body 120, the optical axis Pa of the optical module 110p becomes parallel to the Z-axis direction. When the movable body 110 moves with respect to the fixed body 120 from this state, the optical axis Pa of the optical module 110p swings, and the optical axis Pa is no longer parallel to the Z-axis direction.

Hereinafter, it is assumed that the movable body 110 is not moved with respect to the fixed body 120 and the state in which the optical axis Pa is parallel to the Z-axis direction is maintained. That is, in the description of the shape, positional relationship, operation, and the like of the movable body 110, the fixed body 120, and the like with reference to the optical axis Pa, it is assumed that the optical axis Pa is parallel to the Z-axis direction unless the inclination of the optical axis Pa is specifically described.

Figure 3:
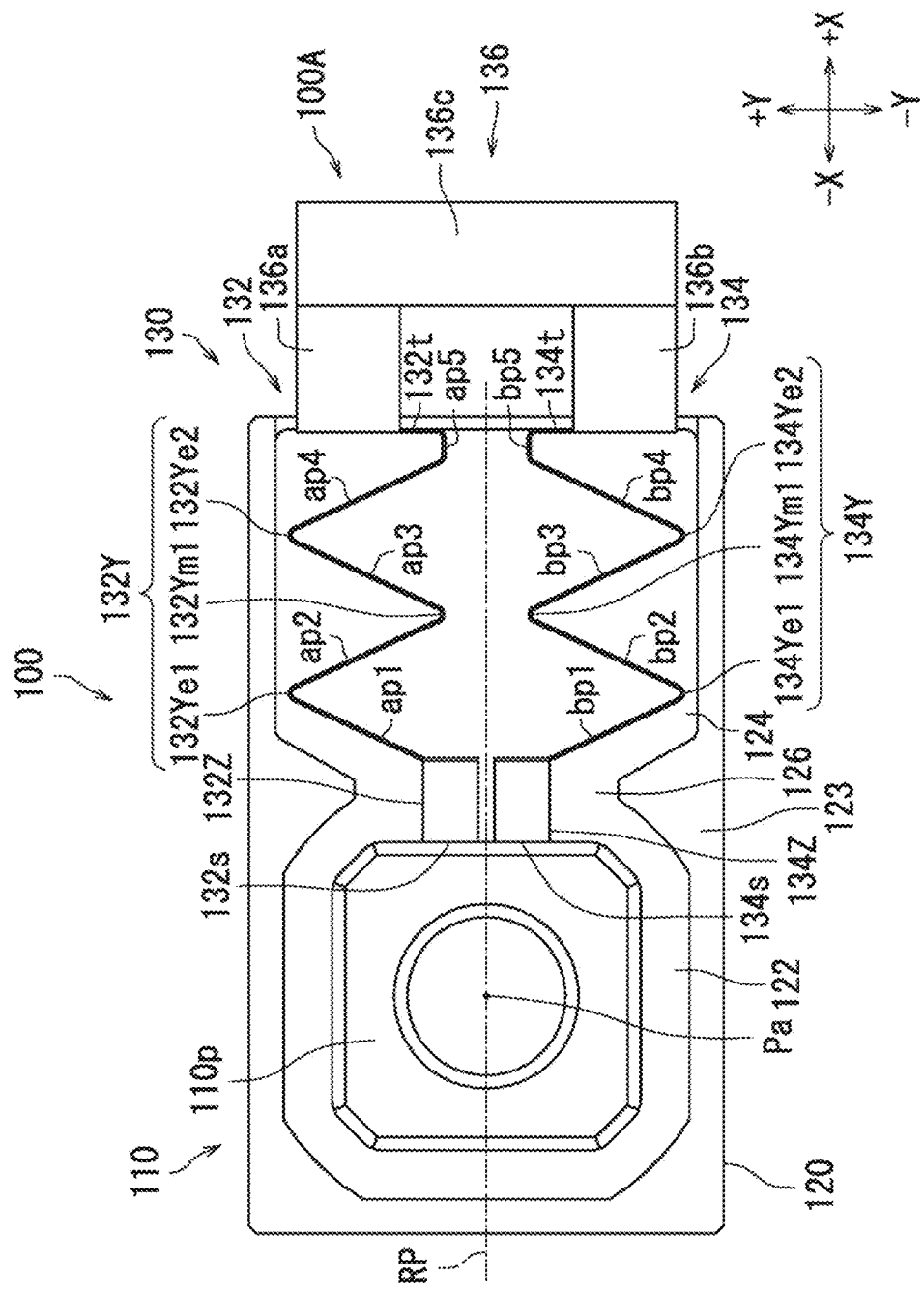
FIG. 3 is a schematic top view of the optical unit of the present embodiment.
Figure 4A:
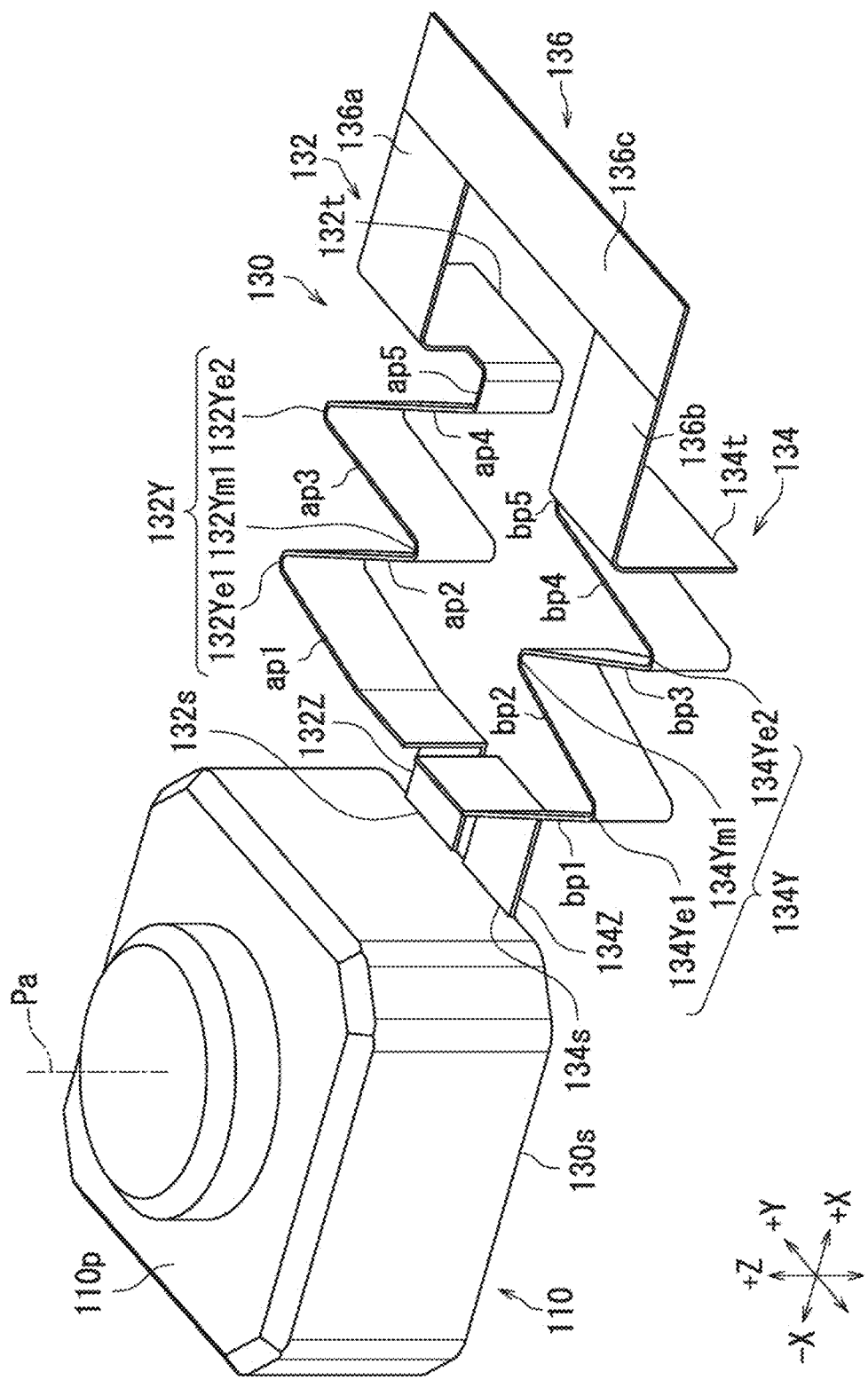
FIG. 4A is a schematic perspective view of a circuit board and an optical module in a shake correction unit of the present embodiment.

Next, the shake correction unit 100A and the optical unit 100 of the present embodiment will be described with reference to FIGS. 1 to 4B. FIG. 3 is a schematic top view of the optical unit 100 of the present embodiment. In FIG. 3, the lid 120F is omitted. FIG. 4A is a schematic perspective view of a circuit board 130 and the optical module 110p in the shake correction unit 100A of the present embodiment. FIG. 4B is a schematic side view of the circuit board 130 and the optical module 110p in the shake correction unit 100A of the present embodiment.

As illustrated in FIGS. 3 to 4B, the shake correction unit 100A includes the movable body 110, the fixed body 120, and the circuit board 130. The fixed body 120 movably supports the movable body 110. The movable body 110 may move (shift) linearly in the axial direction with respect to the fixed body 120, and the movable body 110 may move with respect to the fixed body 120 with the axial direction as the central axis (pitching, yawing, and rolling). The circuit board 130 is connected to the movable body 110. The movable body 110 is rotatable about at least a first rotation axis extending in the first direction (for example, the Z direction). The movable body 110 and the circuit board 130 are accommodated in the fixed body 120. The circuit board 130 includes, for example, a flexible printed circuit (FPC).

The fixed body 120 has a substantially hollow rectangular parallelepiped shape in which a part of a surface on one side is opened. The fixed body 120 has an opening portion. The movable body 110 is placed inside the fixed body 120. For example, the movable body 110 and the optical module 110p are mounted from the outside of the fixed body 120 to the inside of the fixed body 120.

The fixed body 120 has an optical module arrangement region 122 in which the optical module 110p is arranged together with the movable body 110, a circuit board arrangement region 124 in which the circuit board 130 is arranged, and a penetration region 126 that connects the optical module arrangement region 122 and the circuit board arrangement region 124. Here, the length along the Y direction of the optical module arrangement region 122 is substantially equal to the length along the Y direction of the circuit board arrangement region 124. Further, the length along the Y direction of the penetration region 126 is smaller than the length along the Y direction of the optical module arrangement region 122 and the circuit board arrangement region 124.

The circuit board 130 includes a first circuit board 132 and a second circuit board 134. The first circuit board 132 has a first end portion 132s and a second end portion 132t. The first end portion 132s of the first circuit board 132 is connected to the movable body 110 on a first side (−X direction side) of the second direction (for example, the X direction) orthogonal to the Z direction with respect to the movable body 110. Note that the first end portion 132s of the first circuit board 132 does not have to be directly connected to the movable body 110. However, it is preferable that the first end portion 132s of the first circuit board 132 move in conjunction with the movement of the movable body 110. The second end portion 132t of the first circuit board 132 is connected to the fixed body 120.

The second circuit board 134 has a first end portion 134s and a second end portion 134t. The first end portion 134s of the second circuit board 134 is connected to the movable body 110 on a first side (−X direction side) in the X direction with respect to the movable body 110. Note that the first end portion 134s of the second circuit board 134 does not have to be directly connected to the movable body 110. However, it is preferable that the first end portion 134s of the second circuit board 134 move in conjunction with the movement of the movable body 110. The second end portion 134t of the second circuit board 134 is connected to the fixed body 120.

The first circuit board 132 has a first portion ap1, a second portion ap2, and a first outer bent portion 132Ye1 as a third direction bent portion 132Y. The first portion ap1 extends from the −Y direction side in the Y direction to the +Y direction side. The second portion ap2 extends from the +Y direction side to the −Y direction side. In the first outer bent portion 132Ye1 as the third direction bent portion 132Y, an end portion on the +Y direction side of the second portion ap2 is bent in the Y direction with respect to an end portion on the +Y direction side of the first portion ap1. In the present description, a first outer bent portion 132Ye, a first inner bent portion 132Ym1, and a second outer bent portion 132Ye2 may be collectively referred to as a third direction bent portion 132Y.

The first circuit board 132 further includes a third portion ap3, a fourth portion ap4, a fifth portion ap5, the first inner bent portion 132Ym1, and the second outer bent portion 132Ye2. The third portion ap3 extends from the −Y direction side to the +Y direction side. In the first inner bent portion 132Ym1, an end portion on the −Y direction side of the third portion ap3 is bent in the Y direction with respect to an end portion on the −Y direction side of the second portion ap2. The fourth portion ap4 extends from the +Y direction side to the −Y direction side. In the second outer bent portion 132Ye2, an end portion on the +Y direction side of the fourth portion ap4 is bent in the Y direction with respect to an end portion on the +Y direction side of the third portion ap3. The fifth portion ap5 connects an end portion on the −Y direction side of the fourth portion ap4 and the second end portion 132t. Here, the length along the Y direction of the second end portion 132t is almost equal to the length along the Y direction of the first portion ap1 to the fourth portion ap4.

The second circuit board 134 has a first portion bp1, a second portion bp2, and a first outer bent portion 134Ye1 as a third direction bent portion 134Y. The first portion bp1 extends from the +Y direction side to the −Y direction side. The second portion bp2 extends from the −Y direction side to the +Y direction side. In the first outer bent portion 134Ye1 as the third direction bent portion 134Y, an end portion on the −Y direction side of the second portion bp2 is bent in the Y direction with respect to an end portion on the −Y direction side of the first portion bp1. Note that, in the present description, a first outer bent portion 134Ye, a first inner bent portion 134Ym1, and a second outer bent portion 134Ye2 may be collectively referred to as a third direction bent portion 134Y.

The second circuit board 134 further includes a third portion bp3, a fourth portion bp4, a fifth portion bp5, the first inner bent portion 134Ym1, and the second outer bent portion 134Ye2. The third portion bp3 extends from the +Y direction side to the −Y direction side. In the first inner bent portion 134Ym1, an end portion on the +Y direction side of the third portion bp3 is bent in the Y direction with respect to an end portion on the +Y direction side of the second portion bp2. The fourth portion bp4 extends from the −Y direction side to the +Y direction side. In the second outer bent portion 134Ye2, an end portion on the −Y direction side of the fourth portion bp4 is bent in the Y direction with respect to an end portion on the −Y direction side of the third portion bp3. The fifth portion bp5 connects an end portion on the +Y direction side of the fourth portion bp4 and the second end portion 134t. Here, the length along the Y direction of the second end portion 134*t* is almost equal to the length along the Y direction of the first portion bp1 to the fourth portion bp4.

In the shake correction unit 100A of the present embodiment, the elastic resistance of the circuit board 130 can be reduced even in a case where the movable body 110 rotates about the first rotation axis extending in the first direction (Z direction).

Specifically, in the first circuit board 132, the first portion ap1 extends from the −X direction side and the −Y direction side to the +X direction side and the +Y direction side. The second portion ap2 extends from the −X direction side and the +Y direction side to the +X direction side and the −Y direction side. In the first outer bent portion 132Ye1 as a part of the third direction bent portion 132Y, an end portion on the −X direction side and the +Y direction side of the second portion ap2 is bent in the Y direction with respect to an end portion on the +X direction side and the +Y direction side of the first portion ap1.

In the second circuit board 134, the first portion bp1 extends from the −X direction side and the +Y direction side to the +X direction side and the −Y direction side. The second portion bp2 extends from the −X direction side and the −Y direction side to the +X direction side and the +Y direction side. In the first outer bent portion 134Ye1 as a part of the third direction bent portion 134Y, an end portion on the −X direction side and the −Y direction side of the second portion bp2 is bent in the Y direction with respect to an end portion on the +X direction side and the −Y direction side of the first portion bp1. In this manner, the elastic resistance of the circuit board 130 can be reduced even in a case where the movable body 110 rotates about the first rotation axis extending in the first direction.

The distance from the second end portion 132*t* of the first circuit board 132 connected to the fixed body 120 to the first end portion 132*s* of the first circuit board 132 is equal to the natural length from the first end portion 132*s* of the first circuit board 132 to the second end portion 132*t*. Further, the distance from the second end portion 134*t* of the second circuit board 134 connected to the fixed body 120 to the first end portion 134*s* of the second circuit board 134 is equal to the natural length from the first end portion 134*s* of the second circuit board 134 to the second end portion 134*t*.

Since the length of the first circuit board 132 connected to the fixed body 120 is equal to the natural length of the first circuit board 132, the first circuit board 132 can be connected to the fixed body 120 without causing stress. Further, since the length of the second circuit board 134 connected to the fixed body 120 is equal to the natural length of the second circuit board 134, the second circuit board 134 can be connected to the fixed body 120 without causing stress.

The third direction bent portion 132Y of the first circuit board 132 has a fold. Buckling is caused by the fold, and the third direction bent portion 132Y is maintained in a state where no force is applied to the first circuit board 132. The third direction bent portion 134Y of the second circuit board 134 has a fold. Buckling is caused by the fold, and the third direction bent portion 134Y is maintained in a state where no force is applied to the second circuit board 134. In this manner, the elastic resistance of the circuit board 130 can be efficiently reduced.

The first circuit board 132 and the second circuit board 134 are plane symmetric with respect to a reference plane RP having a normal extending in the Y direction. For this reason, the elastic resistance of the circuit board 130 can be made uniform even in a case where the circuit board 130 rotates in any of yawing directions.

The second end portion 132*t* of the first circuit board 132 is located on a second side (+X direction side) of the second direction with respect to the first end portion 132*s* of the first circuit board 132. The second end portion 134*t* of the second circuit board 134 is located on the +X direction side with respect to the first end portion 134*s* of the second circuit board 134. In this manner, the circuit board 130 can be easily arranged.

The circuit board 130 further includes a lead out board 136 in addition to the first circuit board 132 and the second circuit board 134. The lead out board 136 is electrically connected to the first circuit board 132 and the second circuit board 134. The lead out board 136 is located on the +X direction side of the first circuit board 132 and the second circuit board 134. Specifically, the lead out board 136 extends from the +Z direction side of an end portion on the +X direction side of the first circuit board 132 and the second circuit board 134 to the +X direction side.

The lead out board 136 includes a first lead out portion 136*a* connected to the first circuit board 132, a second lead out portion 136*b* connected to the second circuit board 134, and a connection portion 136*c* that connects the first lead out portion 136*a* and the second lead out portion 136*b*.

The first lead out portion 136*a* extends to the +Z direction side with respect to the second end portion 132*t* of the first circuit board 132 and bends in the +X direction. The second lead out portion 136*b* extends to the +Z direction side with respect to the second end portion 134*t* of the second circuit board 134 and bends in the +X direction. The connection portion 136*c* is connected at a +X direction side end portion of the first lead out portion 136*a* and the second lead out portion 136*b*. The lead out board 136 allows the circuit board 130 to be electrically connected to the outside.

As illustrated in FIG. 3, the optical unit 100 includes the shake correction unit 100A and the optical module 110*p*. In this manner, the elastic resistance of the circuit board 130 in the optical unit 100 can be reduced.

As illustrated in FIGS. 4A and 4B, the circuit board 130 further includes a flat portion 130*s* in addition to the first circuit board 132 and the second circuit board 134. The flat portion 130*s* extends in the −X direction from the first end portion 132*s* of the first circuit board 132 and the first end portion 134*s* of the second circuit board 134. The flat portion 130*s* extends on an XY plane.

The flat portion 130*s* functions as at least a part of the movable body 110. Here, the flat portion 130*s* is attached in contact with a surface on the −Z direction side of the optical module 110*p*.

Further, as illustrated in FIGS. 4A and 4B, the first circuit board 132 has a first direction bent portion 132Z extending from the first end portion 132*s* in the +X direction and bent in the +Z direction. An end portion on the +X direction side of the first direction bent portion 132Z is connected to an end portion on the −X direction side of the third direction bent portion 132Y.

Similarly, the second circuit board 134 has a first direction bent portion 134Z extending from the first end portion 134*s* in the +X direction and bent in the +Z direction. An end portion on the +X direction side of the first direction bent portion 134Z is connected to an end portion on the −X direction side of the third direction bent portion 134Y.

Figure 5A:
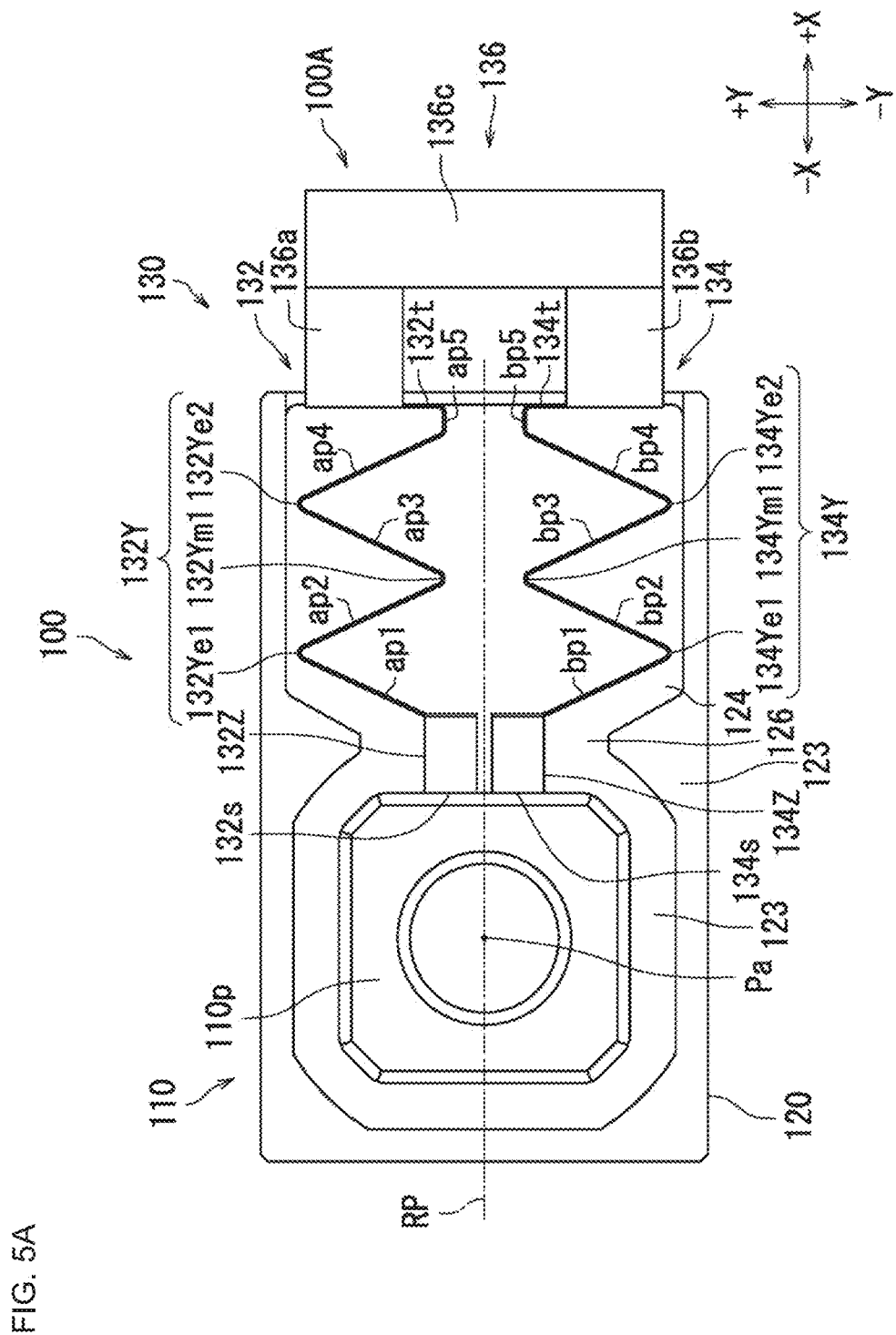
FIG. 5A is a schematic top view of the optical unit of the present embodiment.
Figure 5B:
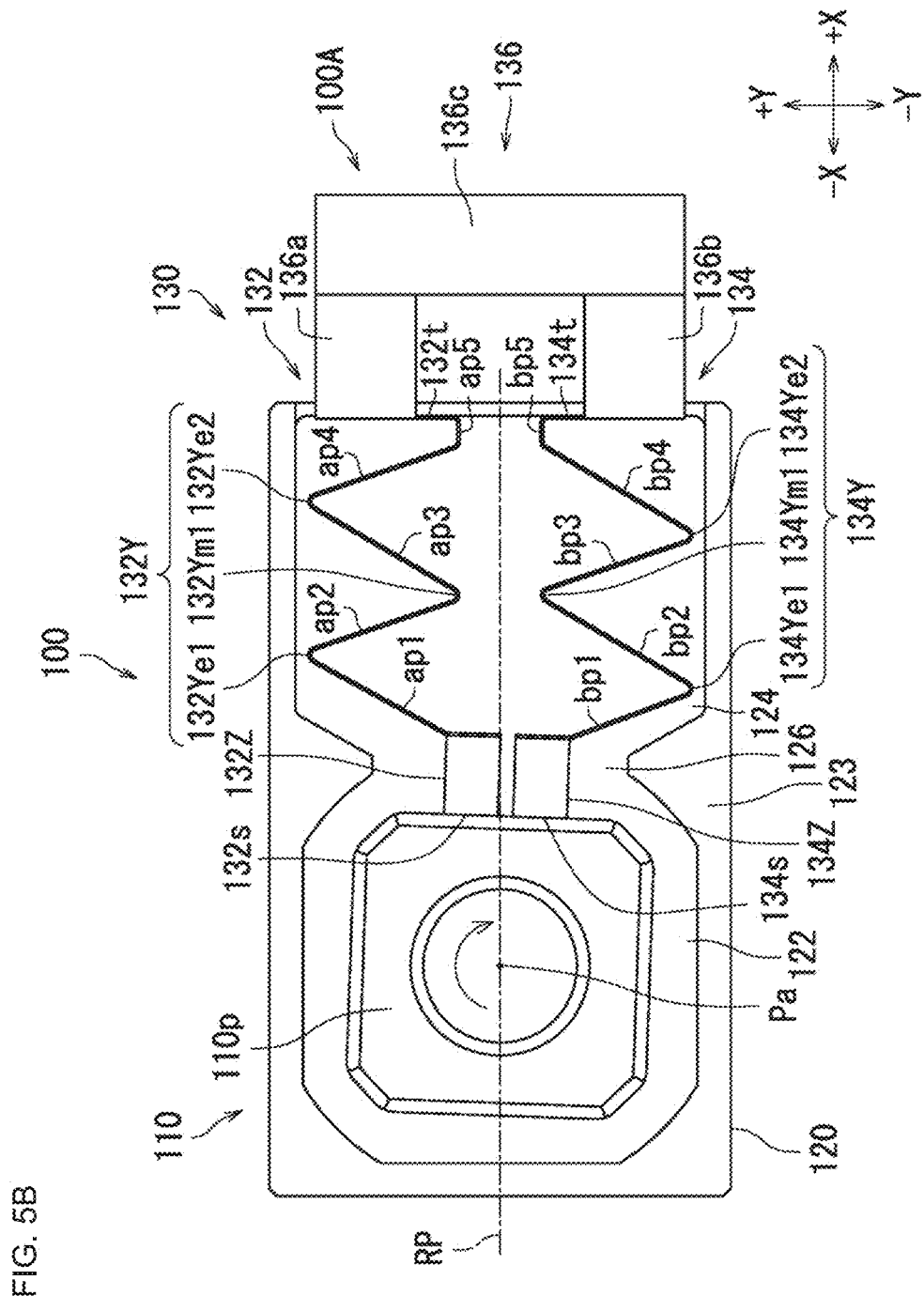
FIG. 5B is a schematic top view of the optical unit of the present embodiment.
Figure 5C:
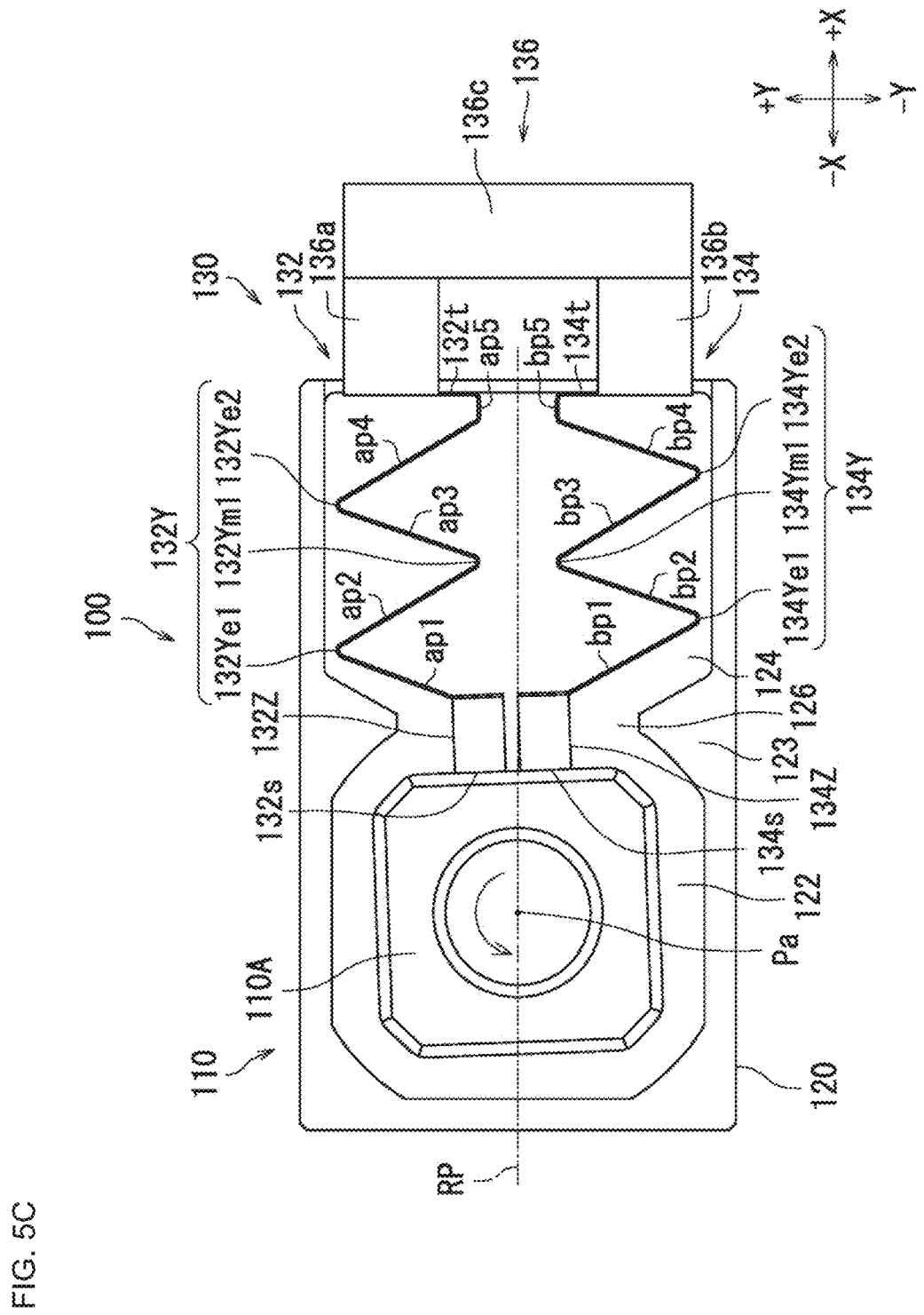
FIG. 5C is a schematic top view of the optical unit of the present embodiment.

Next, the movement of the circuit board 130 in the optical unit 100 of the present embodiment will be described with reference to FIGS. 1 to 5C. FIG. 5A is a schematic top view of the optical unit 100. FIG. 5B is a schematic top view of the optical unit 100 in which the movable body 110 is rotated clockwise with respect to the optical axis Pa, and FIG. 5C is a schematic top view of the optical unit 100 in which the movable body 110 is rotated counterclockwise with respect to the optical axis Pa. Note that, here, illustration of the lid 120F of the optical unit 100 is omitted.

As illustrated in FIG. 5A, the movable body 110 and the circuit board 130 are accommodated in the fixed body 120. Here, the first circuit board 132 and the second circuit board 134 of the circuit board 130 are arranged symmetrically. Specifically, the first circuit board 132 and the second circuit board of the circuit board 130 are arranged symmetrically with respect to the virtual reference plane RP extending on an XZ plane.

As illustrated in FIG. 5B, in a case where the movable body 110 rotates clockwise about the optical axis Pa, the circuit board 130 is deformed. Specifically, as the movable body 110 rotates, the first circuit board 132 contracts along the X-axis direction, and the second circuit board 134 extends along the X-axis direction. For this reason, the first outer bent portion 132Ye1 and the second outer bent portion 132Ye2 of the first circuit board 132 move in the +X direction, and the first outer bent portion 134Ye1 and the second outer bent portion 134Ye2 of the second circuit board 134 move in the −X direction.

As illustrated in FIG. 5C, in a case where the movable body 110 rotates counterclockwise about the optical axis Pa, the circuit board 130 is deformed. Specifically, as the movable body 110 rotates, the first circuit board 132 extends along the X-axis direction, and the second circuit board 134 contracts along the X-axis direction. For this reason, the first outer bent portion 132Ye1 and the second outer bent portion 132Ye2 of the first circuit board 132 move in the −X direction, and the first outer bent portion 134Ye1 and the second outer bent portion 134Ye2 of the second circuit board 134 move in the +X direction.

As described above, the elastic resistance of the circuit board 130 can be reduced regardless of whether the movable body 110 rotates clockwise or counterclockwise about the optical axis Pa. Specifically, as the movable body 110 rotates about the optical axis Pa, one of the first circuit board 132 and the second circuit board 134 contracts and the other extends, so that stress can be dispersed and elastic resistance can be reduced.

As described above, the optical unit 100 includes the shake correction unit 100A and the optical module 110p. In this manner, the elastic resistance of the circuit board 130 in the optical unit 100 can be reduced.

Further, as illustrated in FIG. 1, the smartphone 200 is provided with the optical unit 100 of the present embodiment, so that the elastic resistance of the circuit board 130 in the smartphone 200 can be reduced.

Note that, in the optical unit 100 described above with reference to FIGS. 3 to 5C, the length in the Y direction of the second end portion 132t is almost equal to the length of the first portion ap1 to the fourth portion ap4, and the length in the Y direction of the second end portion 134t is almost equal to the length of the first portion bp1 to the fourth portion bp4. However, the present embodiment is not limited to this configuration.

Figure 6A:
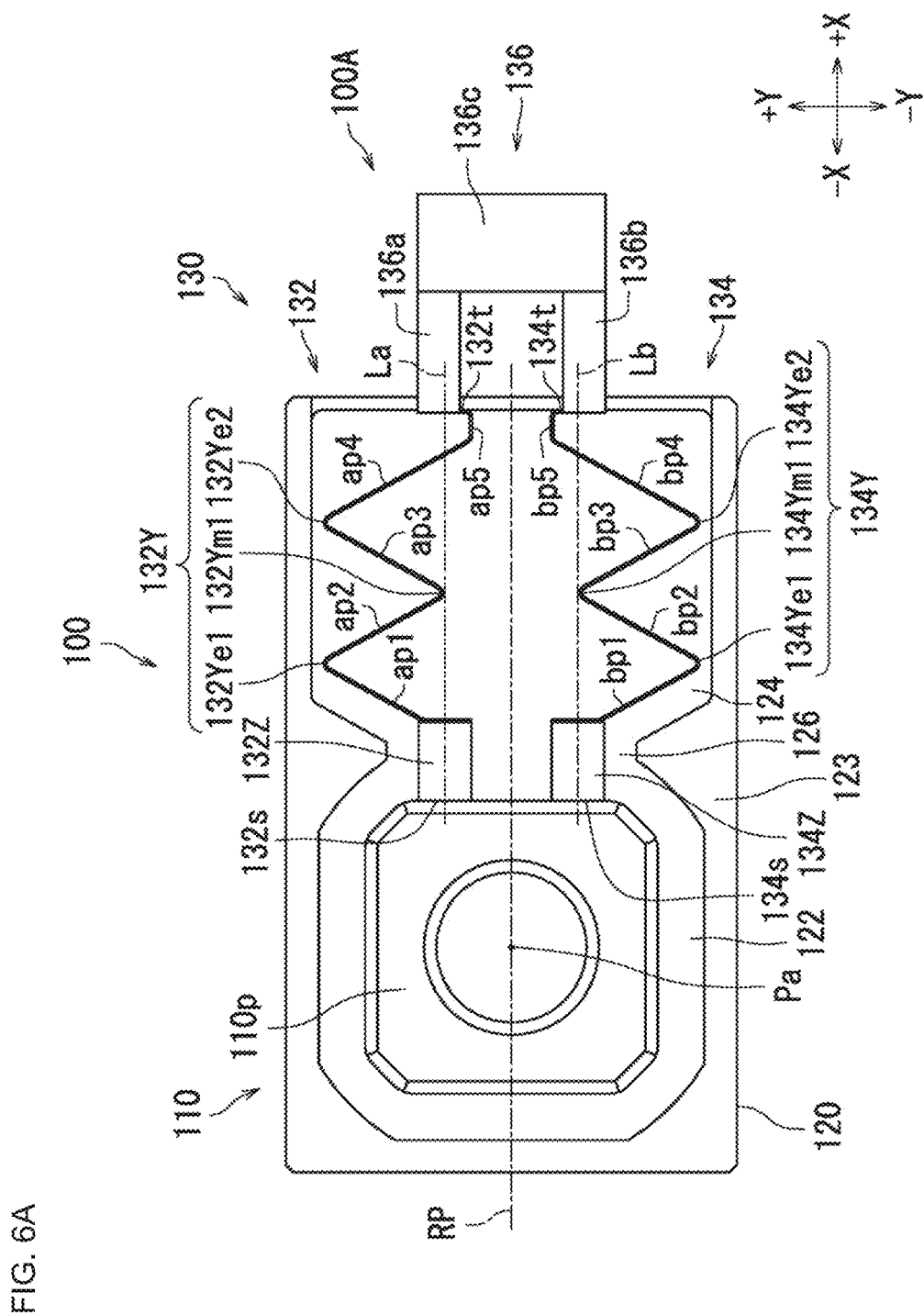
FIG. 6A is a schematic top view of the optical unit of the present embodiment.

Next, the optical unit 100 of the present embodiment will be described with reference to FIGS. 1 to 6A. FIG. 6A is a schematic top view of the optical unit 100 of the present embodiment.

As illustrated in FIG. 6A, a straight line connecting the center along the Y direction of the first end portion 132s of the first circuit board 132 and the center along the Y direction of the second end portion 132t of the first circuit board 132 is parallel to a straight line connecting the center along the Y direction of the first end portion 134s of the second circuit board 134 and the center along the Y direction of the second end portion 134t of the second circuit board 134. In this manner, the first circuit board 132 and the second circuit board 134 can be arranged with high accuracy.

Note that, in the optical unit 100 described above with reference to FIGS. 3 to 6A, each of the first portion ap1 to the fourth portion ap4 of the first circuit board 132 extends diagonally with respect to the Y-axis direction, and each of the first portion bp1 to the fourth portion bp4 of the second circuit board 134 extends diagonally with respect to the Y-axis direction. However, the present embodiment is not limited to this configuration.

Figure 6B:
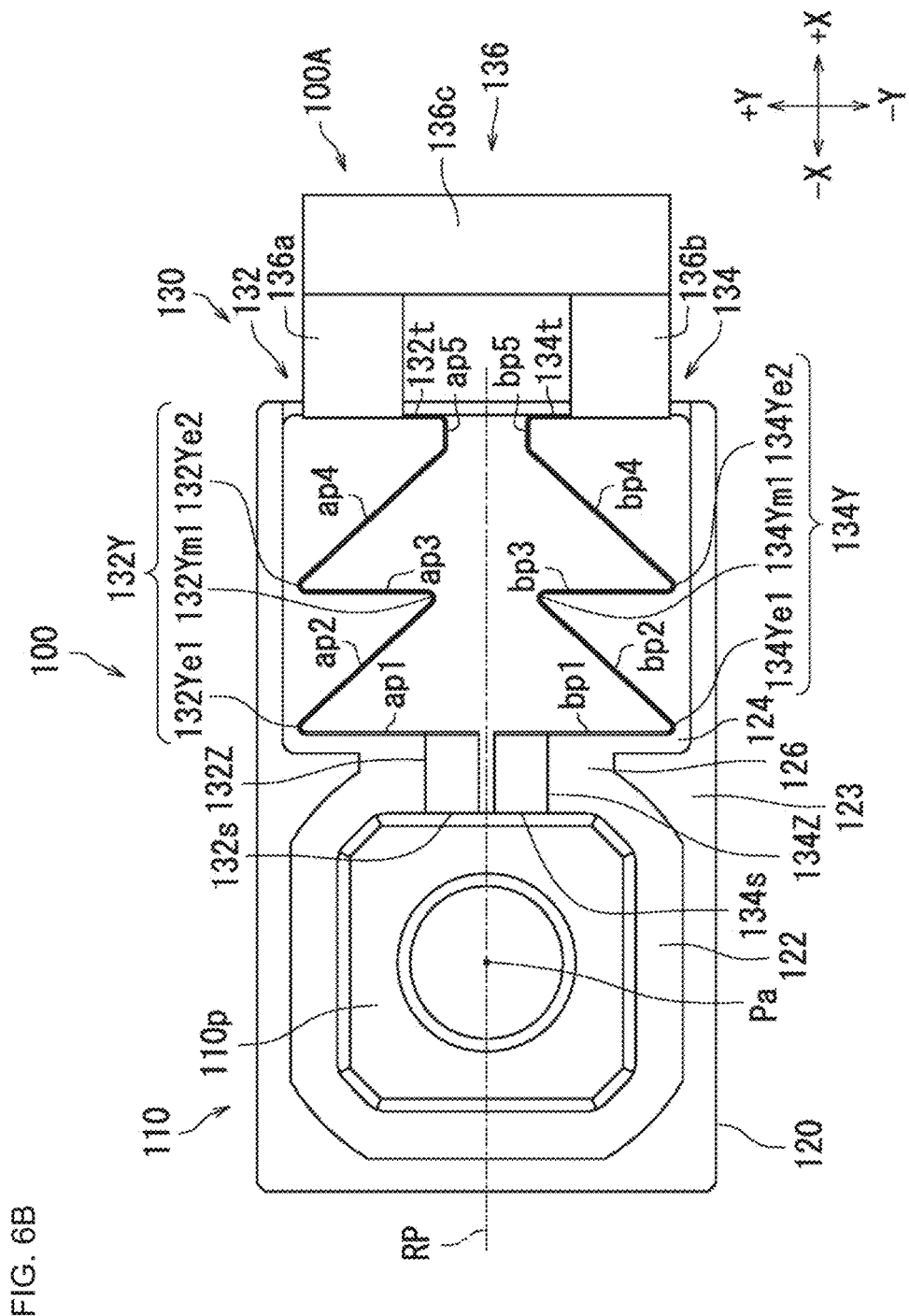
FIG. 6B is a schematic top view of the optical unit of the present embodiment.

Next, the optical unit 100 of the present embodiment will be described with reference to FIGS. 1 to 6C. FIG. 6B is a schematic top view of the optical unit 100 of the present embodiment.

As illustrated in FIG. 6B, the first circuit board 132 has the first portion ap1, the second portion ap2, the third portion ap3, the fourth portion ap4, the fifth portion ap5, the first outer bent portion 132Ye1, the first inner bent portion 132Ym1, and the second outer bent portion 132Ye2. The first portion ap1 extends from the −Y direction side to the +Y direction side in parallel with the Y direction. The second portion ap2 extends from the −X direction side and the +Y direction side to the +X direction side and the −Y direction side. In the first outer bent portion 132Ye1, an end portion on the +Y direction side of the second portion ap2 is bent in the Y direction with respect to an end portion on the +Y direction side of the first portion ap1.

The third portion ap3 extends from the −Y direction side to the +Y direction side in parallel with the Y direction. In the first inner bent portion 132Ym1, an end portion on the −Y direction side of the third portion ap3 is bent in the Y direction with respect to an end portion on the −Y direction side of the second portion ap2. The fourth portion ap4 extends from the −X direction side and the +Y direction side to the +X direction side and the −Y direction side. In the second outer bent portion 132Ye2, an end portion on the +Y direction side of the fourth portion ap4 is bent in the Y direction with respect to an end portion on the +Y direction side of the third portion ap3. The fifth portion ap5 connects an end portion on the −Y direction side of the fourth portion ap4 and the second end portion 132t. The fifth portion ap5 extends from the −X direction side to the +X direction side in parallel with the X direction.

Note that the second circuit board 134 has the first portion bp1, the second portion bp2, the third portion bp3, the fourth portion bp4, the fifth portion bp5, the first outer bent portion 134Ye1, the first inner bent portion 134Ym1, and the second outer bent portion 134Ye2. Note that, since the configuration of the second circuit board 134 is symmetrical with that of the first circuit board 132, the description of the second circuit board 134 is omitted here.

In the optical unit 100 described above with reference to FIG. 6B, each of the first portion ap1 and the third portion ap3 of the first circuit board 132 extends in parallel in the Y-axis direction, and each of the first portion bp and the third portion bp3 of the second circuit board 134 extends in parallel in the Y-axis direction. However, the present embodiment is not limited to this configuration.

Figure 6C:
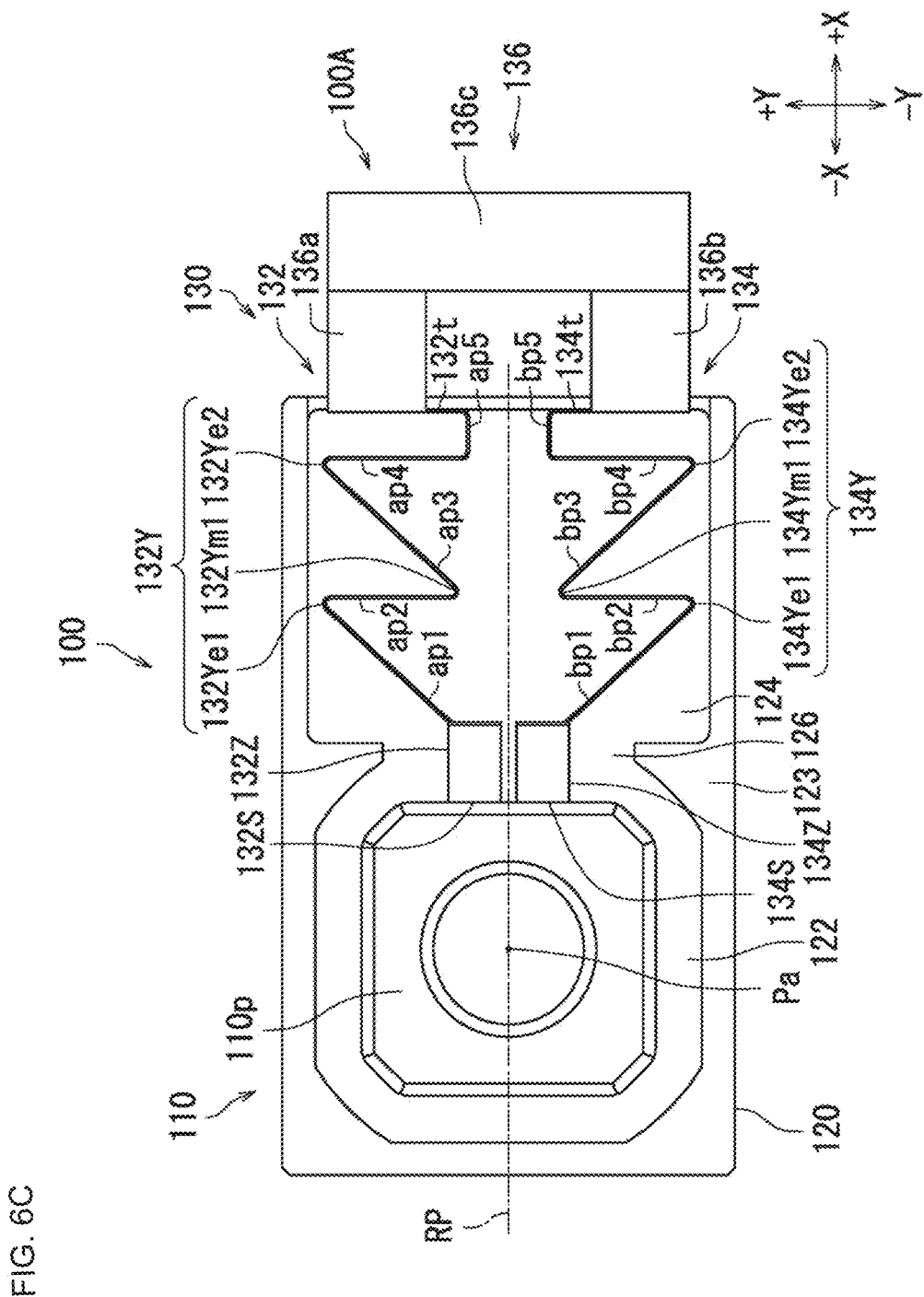
FIG. 6C is a schematic top view of the optical unit of the present embodiment.

As illustrated in FIG. 6C, the first circuit board 132 has the first portion ap1, the second portion ap2, the third portion ap3, the fourth portion ap4, the fifth portion ap5, the first outer bent portion 132Ye1, the first inner bent portion 132Ym1, and the second bent portion 132Ye2. The first portion ap1 extends from the −X direction side and the −Y direction side to the +X direction side and the +Y direction side. The second portion ap2 extends from the +Y direction side to the −Y direction side in parallel with the Y direction. In the first outer bent portion 132Ye1, an end portion on the +Y direction side of the second portion ap2 is bent in the Y direction with respect to an end portion on the +Y direction side of the first portion ap1.

The third portion ap3 extends from the −X direction side and the −Y direction side to the +X direction side and the +Y direction side. In the first inner bent portion 132Ym1, an end portion on the −Y direction side of the third portion ap3 is bent in the Y direction with respect to an end portion on the −Y direction side of the second portion ap2. The fourth portion ap4 extends from the +Y direction side to the −Y direction side in parallel with the Y direction. In the second outer bent portion 132Ye2, an end portion on the +Y direction side of the fourth portion ap4 is bent in the Y direction with respect to an end portion on the +Y direction side of the third portion ap3. The fifth portion ap5 connects an end portion on the −Y direction side of the fourth portion ap4 and the second end portion 132*t*. The fifth portion ap5 extends from the −X direction side to the +X direction side in parallel with the X direction.

Note that the second circuit board 134 has the first portion bp1, the second portion bp2, the third portion bp3, the fourth portion bp4, the fifth portion bp5, the first outer bent portion 134Ye1, the first inner bent portion 134Ym1, and the second outer bent portion 134Ye2. Note that, since the configuration of the second circuit board 134 is symmetrical with that of the first circuit board 132, the description of the second circuit board 134 is omitted here.

Note that, in the above description with reference to FIGS. 3 to 6C, positions in the Y direction of the outer bent portions (for example, the first outer bent portion 132Ye1 and the second outer bent portion 132Ye2) of the third direction bent portion 132Y are the same. However, the present embodiment is not limited to this configuration. Further, positions in the Y direction of the outer bent portions (for example, the first outer bent portion 134Ye1 and the second outer bent portion 134Ye2) of the third direction bent portion 134Y are the same. However, the present embodiment is not limited to this configuration.

Figure 7:
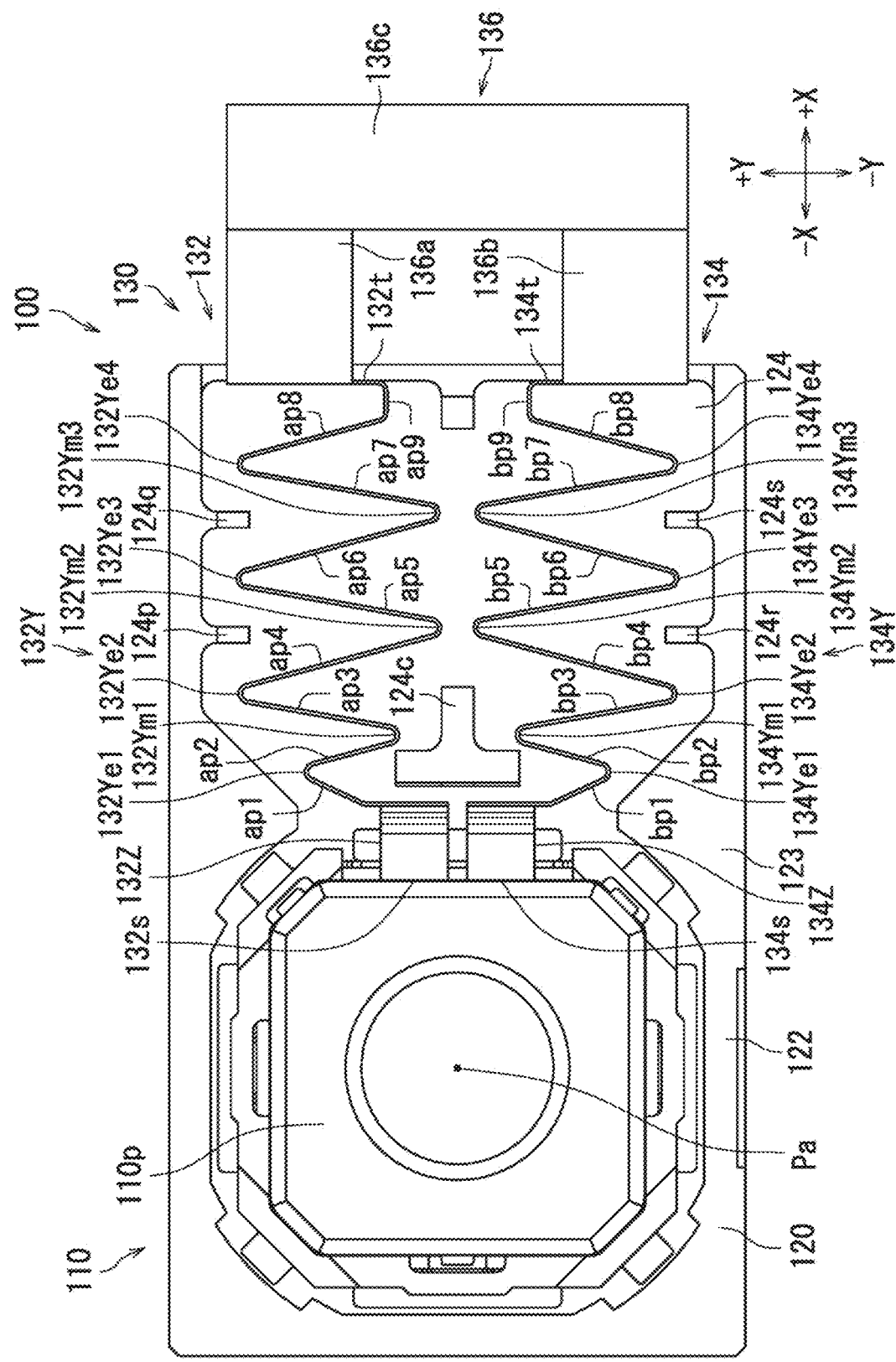
FIG. 7 is a schematic top view of the optical unit of the present embodiment.
Figure 8:
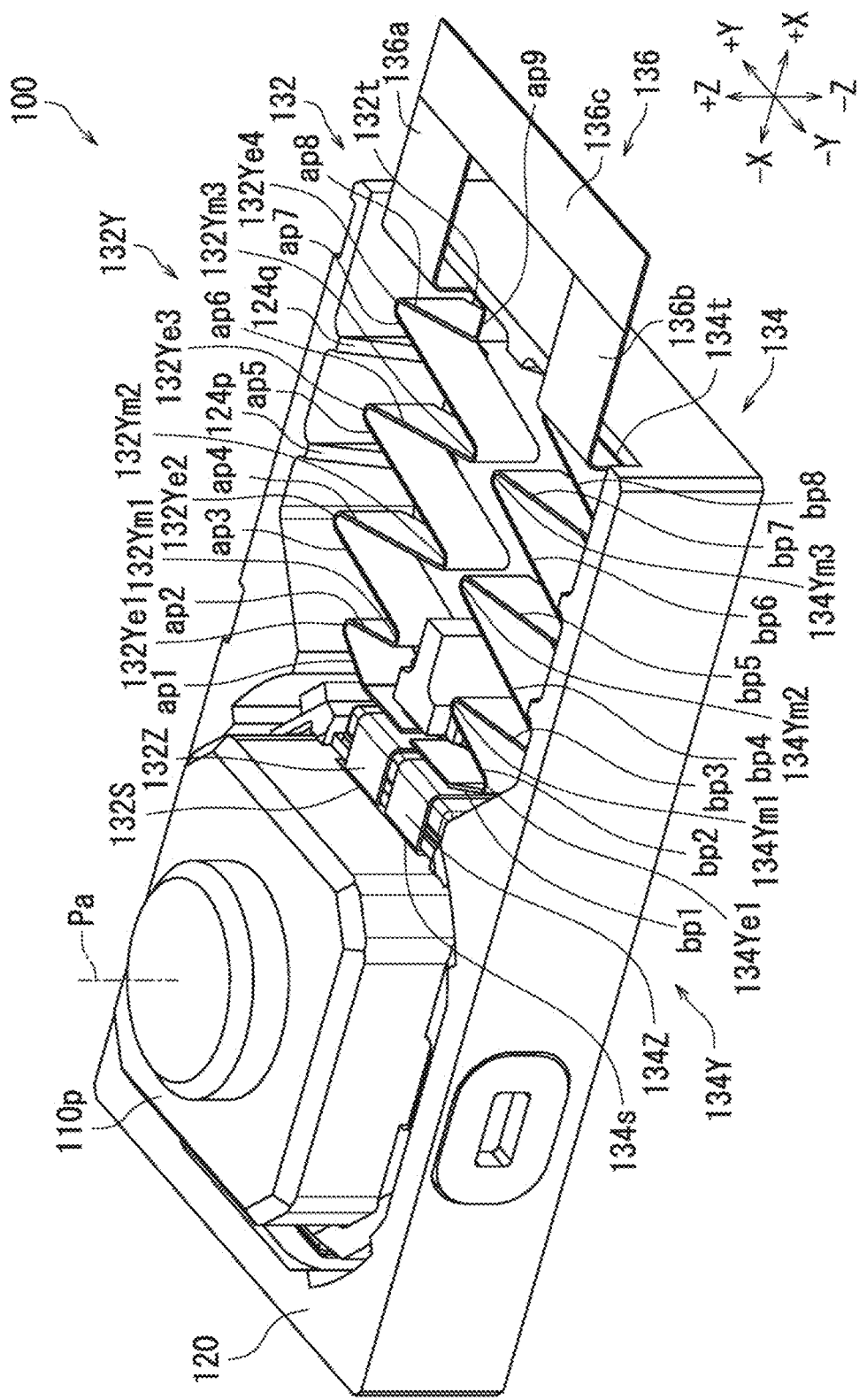
FIG. 8 is a schematic perspective view of the optical unit of the present embodiment.
Figure 9:
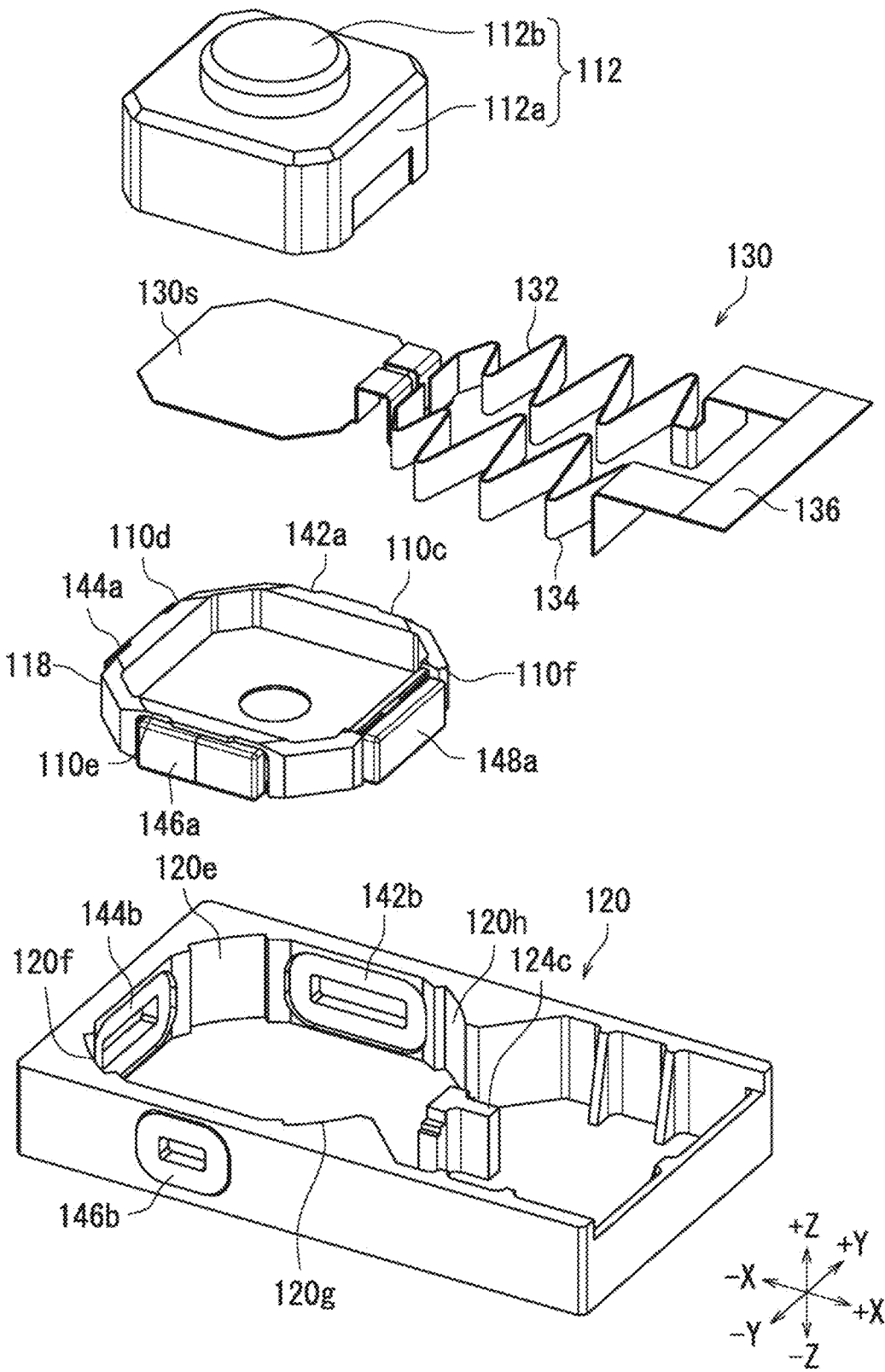
FIG. 9 is a schematic exploded perspective view of the optical unit of the present embodiment.

Next, the movement of the circuit board 130 in the optical unit 100 of the present embodiment will be described with reference to FIGS. 1 to 9. FIG. 7 is a schematic top view of the optical unit 100 of the present embodiment. FIG. 8 is a schematic perspective view of the optical unit 100 of the present embodiment. FIG. 9 is a schematic exploded perspective view of the optical unit 100 of the present embodiment. Here, too, the illustration of the lid 120F is omitted.

The first circuit board 132 is located on the +Y direction side with respect to the second circuit board 134. The third direction bent portion 132Y of the first circuit board 132 includes the first outer bent portion 132Ye1, the first inner bent portion 132Ym1, the second outer bent portion 132Ye2, a second inner bent portion 132Ym2, and a third outer bend portion 132Ye3. The first inner bent portion 132Ym1 is located closer to the second end portion 132*t* than the first outer bent portion 132Ye1. The second outer bent portion 132Ye2 is located closer to the second end portion 132*t* than the first inner bent portion 132Ym1. The second inner bent portion 132Ym2 is located closer to the second end portion 132*t* than the second outer bent portion 132Ye2. The third outer bent portion 132Ye3 is located closer to the second end portion 132*t* than the second inner bent portion 132Ym2. In the first circuit board 132, the second outer bent portion 132Ye2 and the third outer bent portion 132Ye3 are located further on the +Y direction side than the first outer bent portion 132Ye1.

The third direction bent portion 132Y of the first circuit board 132 includes a third inner bent portion 132Ym3 and a fourth outer bent portion 132Ye4. The third inner bent portion 132Ym3 is located closer to the second end portion 132*t* than the second outer bent portion 132Ye2. The fourth outer bent portion 132Ye4 is located closer to the second end portion 132*t* than the third inner bent portion 132Ym3.

The third direction bent portion 134Y of the second circuit board 134 includes the first outer bent portion 134Ye1, the first inner bent portion 134Ym1, the second outer bent portion 134Ye2, a second inner bent portion 134Ym2, and a third outer bend portion 134Ye3. The first inner bent portion 134Ym1 is located closer to the second end portion 134*t* than the first outer bent portion 134Ye1. The second outer bent portion 134Ye2 is located closer to the second end portion 134*t* than the first inner bent portion 134Ym1. The second inner bent portion 134Ym2 is located closer to the second end portion 134*t* than the second outer bent portion 134Ye2. In the second circuit board 134 in which the third outer bent portion 134Ye3 is located closer to the second end portion 134*t* than the second inner bent portion 134Ym2, the second outer bent portion 134Ye2 and the third outer bent portion 134Ye3 are located further on the −Y direction side than the first outer bend portion 134Ye1.

The third direction bent portion 134Y of the second circuit board 134 includes a third inner bent portion 134Ym3 and a fourth outer bent portion 134Ye4. The third inner bent portion 134Ym3 is located closer to the second end portion 134*t* than the second outer bent portion 134Ye2. The fourth outer bend portion 134Ye4 is located closer to the second end portion 134*t* than the third inner bend portion 134Ym3.

In the third direction bent portion 132Y, the first outer bent portion 132Ye1 closer to the first end portion 132*s* is located on the inner side than the second outer bent portion 132Ye2 and the third outer bent portion 132Ye3. Similarly, in the third direction bent portion 134Y, the first outer bent portion 134Ye1 closer to the first end portion 134*s* is located on the inner side than the second outer bent portion 134Ye2 and the third outer bent portion 134Ye3. For this reason, influence of the movement of the movable body 110 on the first circuit board 132 and the second circuit board 134 can be suppressed.

As illustrated in FIG. 9, the movable body 110 has the flat portion 130*s* of the circuit board 130 and a holder 118. The holder 118 accommodates the optical module 110*p*. The movable body 110 has a first main surface 110*a*, a second main surface 110*b*, a first side surface 110*c*, a second side surface 110*d*, a third side surface 110*e*, and a fourth side surface 110*f*. The first side surface 110*c*, the second side surface 110*d*, the third side surface 110*e* and the fourth side surface 110*f* are connected to the first main surface 110*a* and the second main surface 110*b*.

As illustrated in FIG. 9, the fixed body 120 has a first side portion 120*a*, a second side portion 120*b*, a third side portion 120*c*, and a fourth side portion 120*d*. Specifically, the optical module arrangement region 122 is surrounded by the first side portion 120*a*, the second side portion 120*b*, the third side portion 120*c*, and the fourth side portion 120*d*. The first side portion 120*a* faces the first side surface 110*c* of the movable body 110. The second side portion 120*b* faces the second side surface 110*d* of the movable body 110. The third side portion 120*c* faces the third side surface 110*e* of the movable body 110. The fourth side portion 120*d* faces the fourth side surface 110*f* of the movable body 110.

The fourth side portion 120d is located on the +X direction side of the movable body 110. The optical unit 100 includes a first magnet 142a, a second magnet 144a, a third magnet 146a, a first coil 142b, a second coil 144b, and a third coil 146b. A moving mechanism is formed of the first magnet 142a and the first coil 142b. A moving mechanism is formed of the second magnet 144a and the second coil 144b. Further, a moving mechanism is formed of the third magnet 146a and the third coil 146b. Typically, these three moving mechanisms can move the movable body 110 in three orthogonal axial directions.

The first magnet 142a is arranged on the first side surface 110c of the movable body 110. The second magnet 144a is arranged on the second side surface 110d of the movable body 110. The third magnet 146a is arranged on the third side surface 110e of the movable body 110. The first coil 142b is arranged on the first side portion 120a of the fixed body 120. The second coil 144b is arranged on the second side portion 120b of the fixed body 120. The third coil 146b is arranged on the third side portion 120c of the fixed body 120. For this reason, the circuit board 130 and the moving mechanism can move the movable body 110 in any of three orthogonal axial directions without interfering with each other.

The shake correction unit 100A corrects a shake of the optical module 110p having at least an imaging element. The shake correction unit 100A includes the movable body 110, the fixed body 120 that movably supports the movable body 110, and the circuit board 130 connected to the movable body 110. The movable body 110 is rotatable about at least the first rotation axis (Z axis) extending in the first direction (Z direction). The circuit board 130 includes a first circuit board 132 and a second circuit board 134.

As illustrated in FIGS. 7 and 9, in the fixed body 120, a rib 124c is arranged in the circuit board arrangement region 124. The rib 124c faces the first direction bent portion 132Z of the first circuit board 132 and the first direction bent portion 134Z of the second circuit board 134. The rib 124c is arranged between the first circuit board 132 and the second circuit board 134. The rib 124c avoids contact between the first circuit board 132 and the second circuit board 134 and improves the strength of the fixed body 120.

Further, in the fixed body 120, ribs 124p, 124q, 124r and 124s are arranged in the circuit board arrangement region 124. The ribs 124p and 124q project from a side surface on the +Y direction side of the circuit board arrangement region 124 toward the −Y direction. The rib 124p is located between the second outer bent portion 132Ye2 and the third outer bent portion 132Ye3, and projects toward the second inner bent portion 132Ym2. The rib 124q is located between the third outer bent portion 132Ye3 and the fourth outer bent portion 132Ye4, and projects toward the third inner bent portion 132Ym3. The ribs 124p and 124q avoid contact with the first circuit board 132 even in a case where the first circuit board 132 is deformed, and improve the strength of the fixed body 120.

The ribs 124r and 124s project from a side surface on the −Y direction side of the circuit board arrangement region 124 toward the +Y direction. The rib 124r is located between the second outer bent portion 134Ye2 and the third outer bent portion 134Ye3, and projects toward the second inner bent portion 134Ym2. The rib 124q is located between the third outer bent portion 134Ye3 and the fourth outer bent portion 134Ye4, and projects toward the third inner bent portion 134Ym3. The ribs 124r and 124s avoid contact with the second circuit board 134 even in a case where the second circuit board 134 is deformed, and improve the strength of the fixed body 120.

Further, as can be understood from FIG. 9, the distance from the second end portion 132t of the first circuit board 132 connected to the fixed body 120 to the first end portion 132s of the first circuit board 132 is equal to the natural length from the first end portion 132s of the first circuit board 132 to the second end portion 132t. In this manner, the first circuit board 132 can be connected to the fixed body 120 without causing stress.

Similarly, the distance from the second end portion 134t of the second circuit board 134 connected to the fixed body 120 to the first end portion 134s of the second circuit board 134 is equal to the natural length from the first end portion 134s of the second circuit board 134 to the second end portion 134t. In this manner, the second circuit board 134 can be connected to the fixed body 120 without causing stress.

Figure 10A:
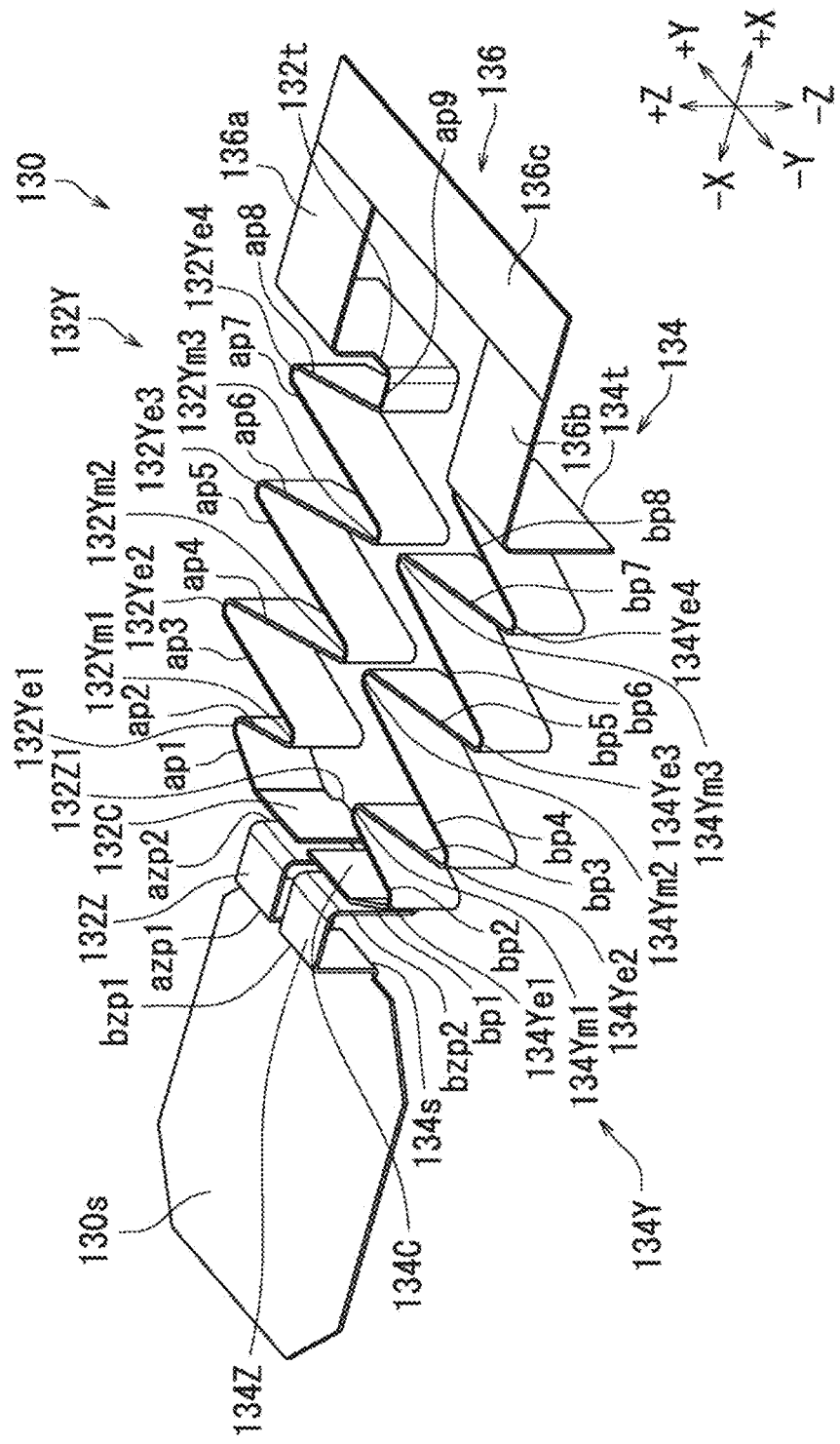
FIG. 10A is a schematic perspective view of a circuit board in the optical unit of the present embodiment.

Next, the circuit board 130 in the shake correction unit 100A of the present embodiment will be described with reference to FIGS. 1 to 10B. FIG. 10A is a schematic perspective view of the circuit board 130 in the shake correction unit 100A of the present embodiment, and FIG. 10B is a schematic side view of the circuit board 130 in the shake correction unit 100A of the present embodiment.

Figure 10B:
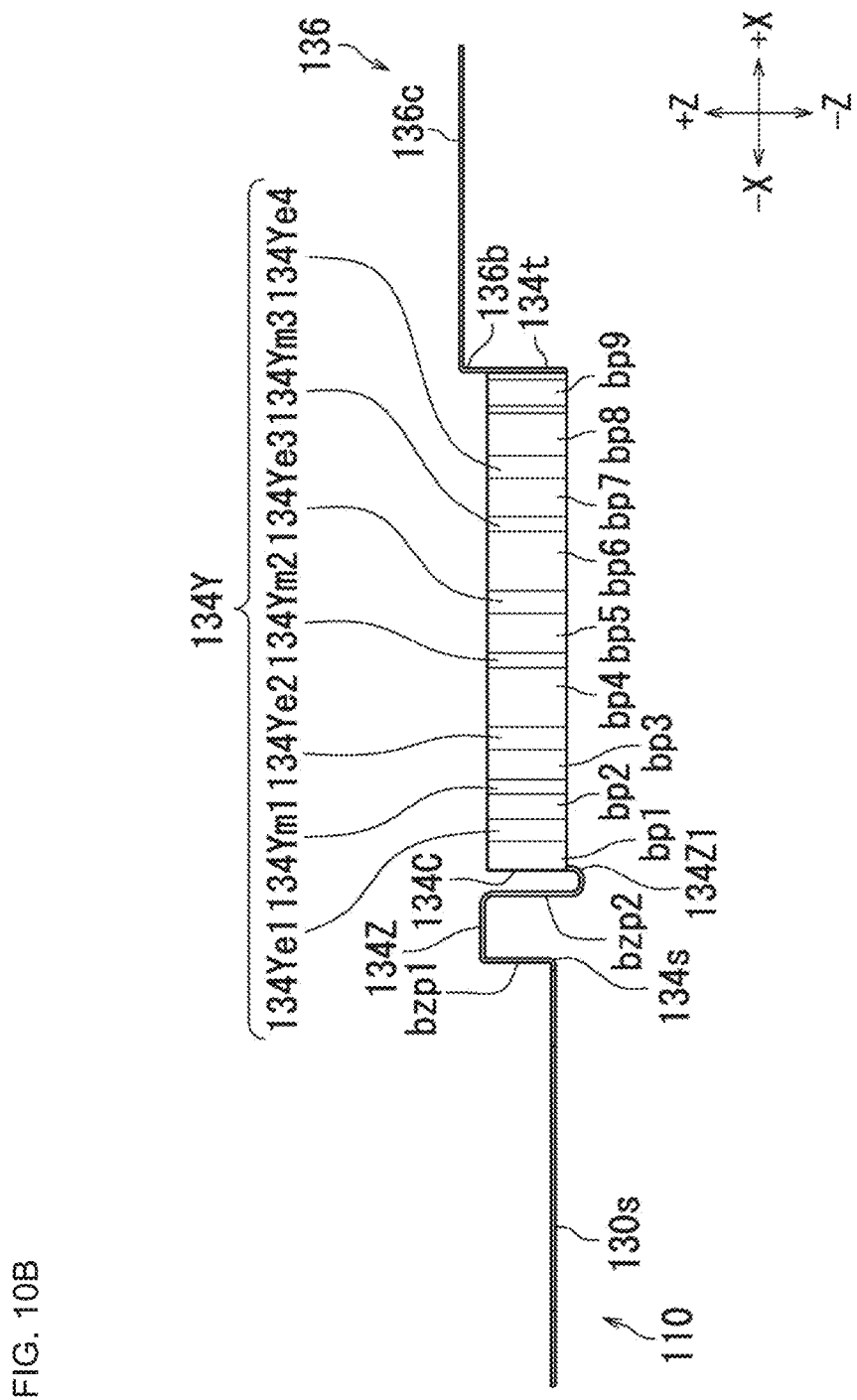
FIG. 10B is a schematic side view of the circuit board in the optical unit of the present embodiment.

As illustrated in FIGS. 10A and 10B, the first circuit board 132 has a first direction extended first portion azp1, a first direction extended second portion azp2, and a first direction bent portion 132Z. The first direction extended first portion azp1 extends from the −Z direction side to the +Z direction side. The first direction extended second portion azp2 extends from the +Z direction side to the −Z direction side. The first direction bent portion 132Z is connected to each of an end portion on the +Z direction side of the first direction extended first portion azp1 and an end portion on the +Z direction side of the first direction extended second portion azp2.

Similarly, the second circuit board 134 has a first direction extended first portion bzp1 extending from the −Z direction side to the +Z direction side, a first direction extended second portion bzp2 extending from the +Z direction side to the −Z direction side, and the first direction bent portion 134Z connected to each of an end portion on the +Z direction side of the first direction extended first portion bzp1 and an end portion on the +Z direction side of the first direction extended second portion bzp2. In this manner, the elastic resistance of the circuit board 130 can be reduced even in a case where the movable body 110 moves particularly in the pitching direction.

In the first circuit board 132, the first direction extended first portion azp1 is connected to the movable body 110. The first direction bent portion 132Z extends from the −X direction side toward the +X direction side.

In the second circuit board 134, the first direction extended first portion bzp1 is connected to the movable body 110. The first direction bent portion 134Z extends from the −X direction side toward the +X direction side. Influence of the movement of the movable body 110 on the first circuit board 132 and the second circuit board 134 can be suppressed.

The first circuit board 132 further includes a first direction bent portion 132Z1 and a connecting portion 132C. The first direction bent portion 132Z1 has a curved structure curved to the −Y direction side. The first direction bent portion 132Z1 is connected to each of an end portion on the −Z direction side of the first direction extended second portion azp2 and an end portion on the −Z direction side of the connecting portion 132C. An end portion on the +Y direction side of the connection part 132C is connected to the first portion ap1. The first direction bent portion 132Z1 is located further on the −Z direction side than the third direction bent portion 132Y. As the first direction bent portion 132Z1 connects the first direction extended second portion azp2 and the connecting portion 132C, the first direction bent portion 132Z1 can be interlocked with the movement of the flat portion 130s. Typically, when the flat portion 130s moves toward the −X direction side, the first direction bent portion 132Z1 moves to open, and the first circuit board 132 extends along the X-axis direction as a whole. Similarly, when the flat portion 130s moves toward the +X direction side, the first direction bent portion 132Z1 moves to close, and the first circuit board 132 contracts along the X-axis direction as a whole.

The second circuit board 134 further includes a first direction bent portion 134Z1 and a connecting portion 134C. The first direction bent portion 134Z1 has a curved structure curved to the −Y direction side. The first direction bent portion 134Z1 is connected to each of an end portion on the −Z direction side of the first direction extended second portion bzp2 and an end portion on the −Z direction side of the connecting portion 134C. An end portion on the −Y direction side of the connection part 134C is connected to the first portion bp1. The first direction bent portion 134Z1 is located further on the −Z direction side than the third direction bent portion 134Y. As the first direction bent portion 134Z1 connects the first direction extended second portion bzp2 and the connecting portion 134C, the first direction bent portion 134Z1 can be interlocked with the movement of the flat portion 130s. Typically, when the flat portion 130s moves toward the −X direction side, the first direction bent portion 134Z1 moves to open, and the second circuit board 134 extends along the X-axis direction as a whole. Similarly, when the flat portion 130s moves toward the +X direction side, the first direction bent portion 134Z1 moves to close, and the second circuit board 134 contracts along the X-axis direction as a whole.

Figure 11:
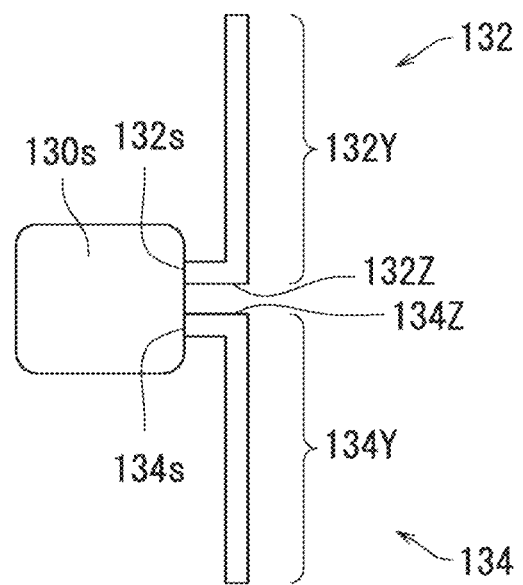
FIG. 11 is a development view of the circuit board in the optical unit of the present embodiment.

Next, the movement of the circuit board 130 in the optical unit 100 of the present embodiment will be described with reference to FIGS. 1 to 11. FIG. 11 is a development view of the circuit board 130 in the optical unit 100 of the present embodiment.

As illustrated in FIG. 11, the first circuit board 132 is connected to an end portion of the flat portion 130s. The first circuit board 132 extends in one direction from an end portion of the flat portion 130s and then bends outward. The first direction bent portion 132Z is formed from a portion extending in one direction from an end portion of the flat portion 130s, and the third direction bent portion 132Y is further formed from a bent portion.

Similarly, the second circuit board 134 extends in one direction from an end portion of the flat portion 130s and then bends outward. The first direction bent portion 134Z is formed from a portion extending in one direction from an end portion of the flat portion 130s, and the third direction bent portion 134Y is further formed from a bent portion.

The shake correction unit 100A may swingably support the optical module 110p. The shake correction unit 100A may swingably support a bottom surface (−Z direction side) of the optical module 110p.

Figure 12:
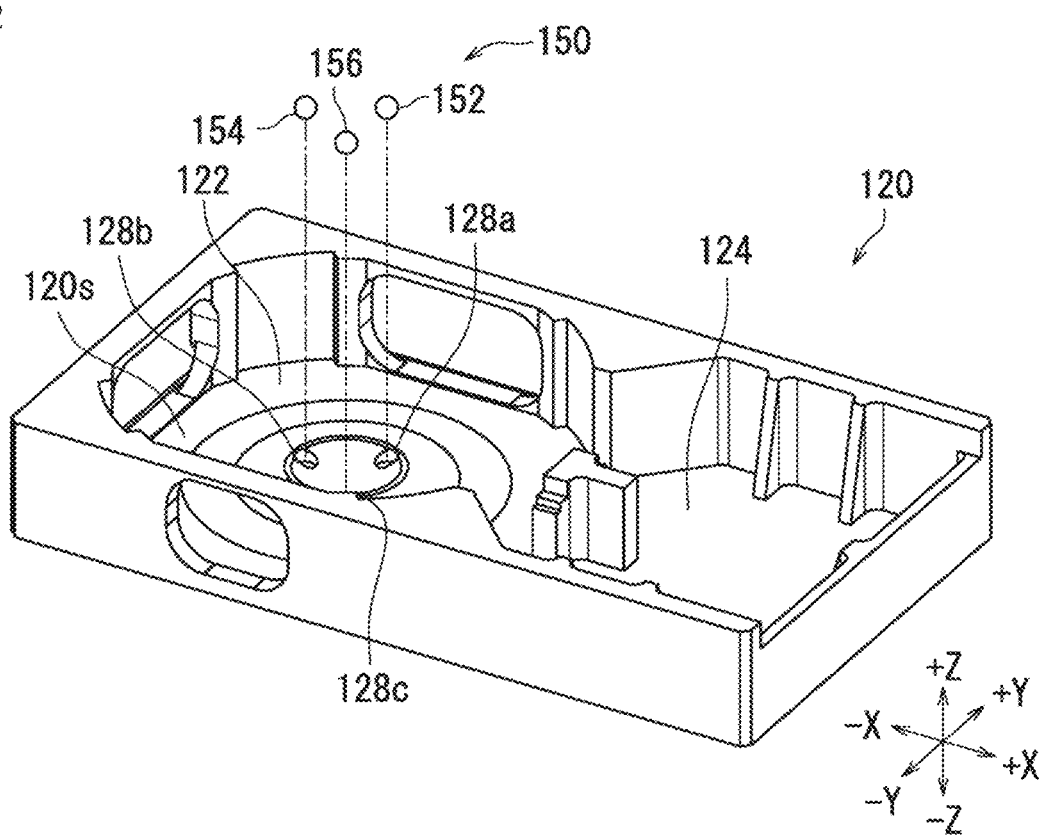
FIG. 12 is a schematic perspective view of a fixed body in the shake correction unit of the present embodiment.

Next, the optical unit 100 of the present embodiment will be described with reference to FIGS. 1 to 12. FIG. 12 is a schematic exploded view of the fixed body 120 in the shake correction unit 100A of the present embodiment.

As illustrated in FIG. 12, an inner peripheral surface 120s of the fixed body 120 is provided with a recess 128. The recess 128 is provided corresponding to a plurality of support mechanisms 150. Specifically, the recess 128 includes a first recess 128a corresponding to a first support mechanism 152, a second recess 128b corresponding to a second support mechanism 154, and a third recess 128c corresponding to a third support mechanism 156.

A plurality of the support mechanisms 150 support the movable body 110 with respect to the fixed body 120. A plurality of the support mechanisms 150 are arranged on the same circumference around the optical axis Pa.

A swing mechanism 140 swings the movable body 110 supported by the support mechanism 150 with respect to the fixed body 120. The swing mechanism 140 is located radially outside the support mechanism 150. According to the optical unit 100 of the present embodiment, since the support mechanism 150 that supports the movable body 110 is arranged inside the swing mechanism 140, the swing resistance of the movable body 110 can be reduced.

Each of a plurality of the support mechanisms 150 is located between the recess 128 of the fixed body 120 and the movable body 110. Each of a plurality of the support mechanisms 150 has a spherical shape or a partial spherical shape. A spherical portion of the support mechanism 150 comes into contact with the movable body 110, so that the movable body 110 can slide with respect to the support mechanism 150.

A plurality of the support mechanisms 150 are arranged in the recess 128 of the fixed body 120. For example, a plurality of the support mechanisms 150 may be bonded to the recess 128 of the fixed body 120 by an adhesive. Alternatively, a plurality of the support mechanisms 150 may be resin-molded integrally with the fixed body 120. That is, a plurality of the support mechanisms 150 and the fixed body 120 may be a single member. When a plurality of the support mechanisms 150 are arranged in the recess 128 of the fixed body 120, a plurality of the support mechanisms 150 protrude from the inner peripheral surface 120s of the fixed body 120 toward the movable body 110. For this reason, even when the movable body 110 swings with respect to the fixed body 120, it is possible to prevent the movable body 110 from colliding with the fixed body 120.

A plurality of the support mechanisms 150 include the first support mechanism 152, the second support mechanism 154, and the third support mechanism 156. The first support mechanism 152, the second support mechanism 154, and the third support mechanism 156 are arranged at equal intervals. The first support mechanism 152, the second support mechanism 154, and the third support mechanism 156 are arranged in a first recess 128a, a second recess 128b, and a third recess 128c, respectively. For this reason, a plurality of the support mechanisms 150 can stably support the movable body 110 with respect to the fixed body 120.

Figure 13:
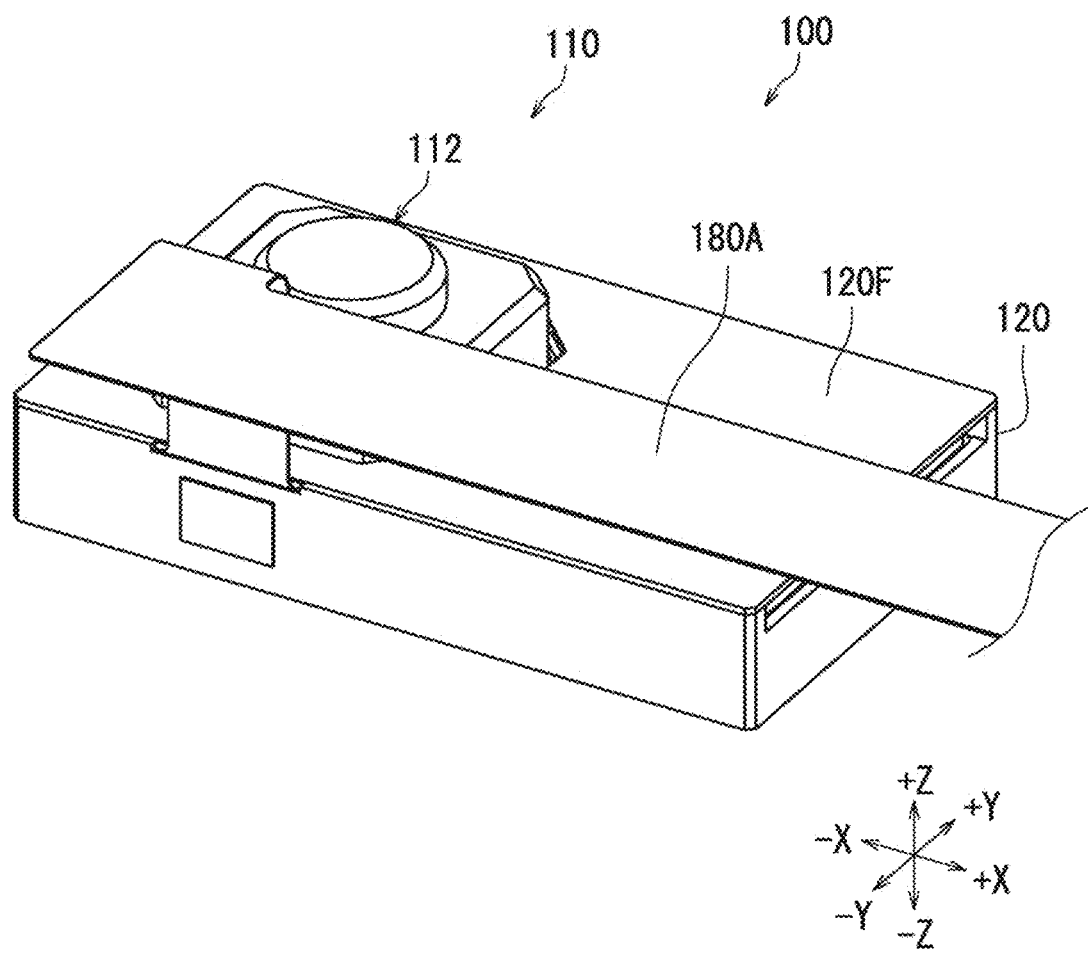
FIG. 13 is a schematic perspective view of the optical unit of the present embodiment.
Figure 14:
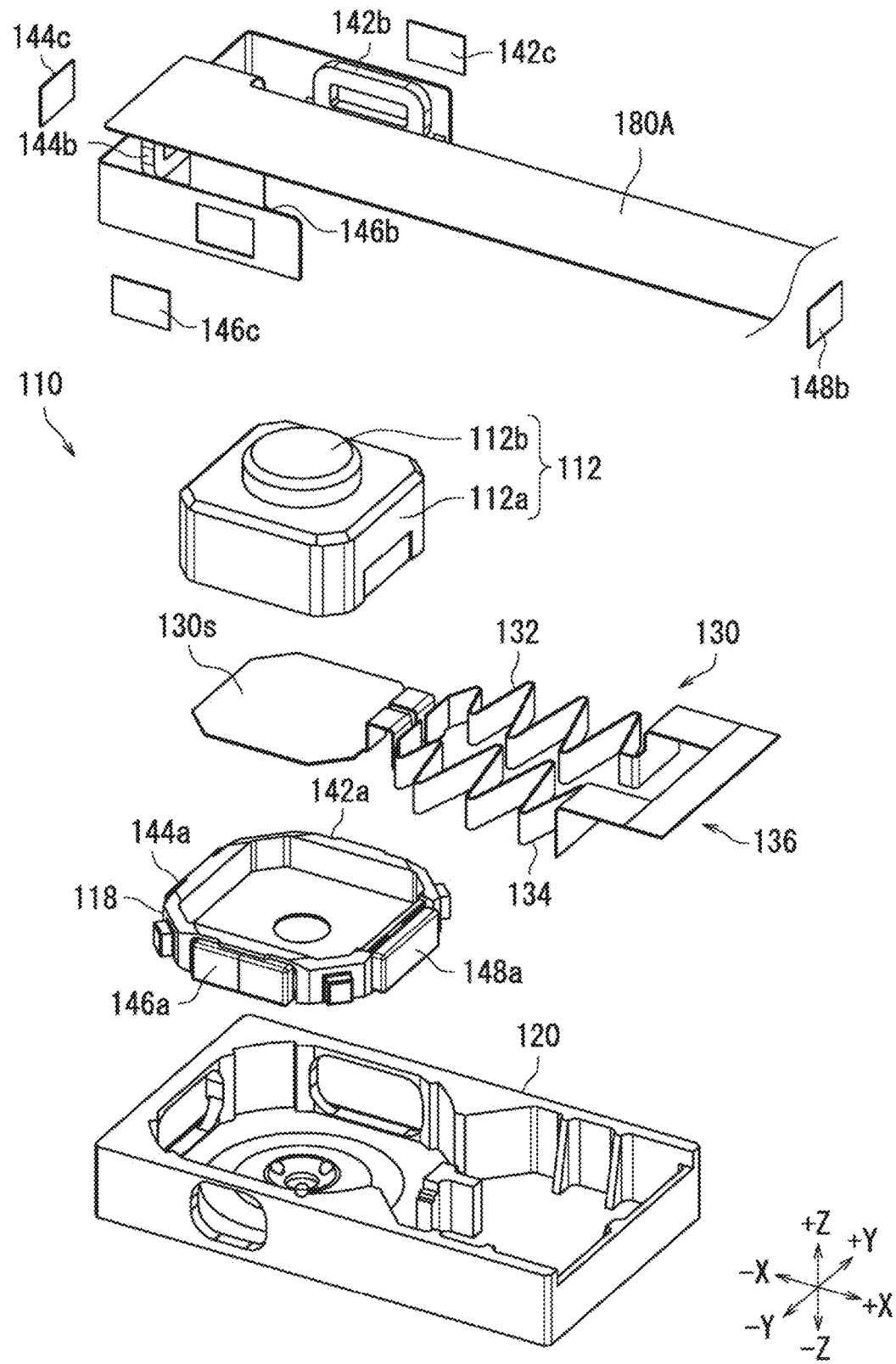
FIG. 14 is a schematic exploded perspective view of the optical unit of the present embodiment.

Next, the optical unit 100 according to the present embodiment will be described with reference to FIGS. 13 and 14. FIG. 13 is a schematic perspective view of the optical unit 100 of the present embodiment, and FIG. 14 is a schematic exploded perspective view of the optical unit 100 of the present embodiment. Note that, in FIG. 14, the lid 120F that covers the fixed body 120 is omitted from illustration for the purpose of preventing the diagram from being excessively complicated.

As illustrated in FIGS. 13 and 14, the optical unit 100 further includes the lid 120F, and a circuit board 130A in addition to the movable body 110, the fixed body 120, the circuit board 130, the swing mechanism 140, and the support mechanism 150. Here, the fixed body 120 extends in the X-axis direction. The lid 120F is located on the +Z direction side with respect to the fixed body 120. The lid 120F covers an opening portion of the fixed body 120. The circuit board 130A or the circuit board 130 includes, for example, a flexible printed circuit (FPC).

The circuit board 130A extends in the X direction. The circuit board 130A is located in the +Z direction of the lid 120F. The first coil 142*b*, the second coil 144*b*, and the third coil 146*b* are attached to the circuit board 130A.

The fixed body 120 accommodates the circuit board 130 together with the movable body 110. The circuit board 130 is separated into two. The circuit board 130 includes the first circuit board 132 and the second circuit board 134. The first circuit board 132 and the second circuit board 134 are arranged symmetrically. Each of the first circuit board 132 and the second circuit board 134 has a bent portion bent in the Y direction.

The optical module 112 has a housing 112*a* and a lens 112*b*. The housing 112*a* has a thin rectangular parallelepiped shape. The lens 112*b* is arranged on the housing 112*a*. The housing 112*a* may include an imaging element in the inside. The optical module 112 including an imaging element is also called a camera module. When the optical module 112 is inserted into the holder 118, the optical module 112 is held by the holder 118.

For example, the lens 112*b* is disposed on the optical axis Pa at the center of one surface of the housing 112*a*. The optical axis Pa and the lens 112*b* face a subject, and light from a direction along the optical axis direction Dp is incident on the optical module 112.

Next, the optical unit 100 according to the present embodiment will be described with reference to FIGS. 13 and 14. FIG. 13 is a schematic perspective view of the optical unit 100 of the present embodiment, and FIG. 14 is a schematic exploded perspective view of the optical unit 100 of the present embodiment. Note that, in FIG. 14, the lid 120F that covers the fixed body 120 is omitted from illustration for the purpose of preventing the diagram from being excessively complicated.

As illustrated in FIGS. 13 and 14, the optical unit 100 further includes the lid 120F, the circuit board 130A, and the circuit board 130 in addition to the movable body 110, the fixed body 120, the circuit board 130, the swing mechanism 140, and the support mechanism 150. Here, the fixed body 120 extends in the X-axis direction. The lid 120F is located on the +Z direction side with respect to the fixed body 120. The lid 120F covers an opening portion of the fixed body 120. The circuit board 130A or the circuit board 130 includes, for example, a flexible printed circuit (FPC).

The circuit board 130A extends in the X direction. The circuit board 130A is located in the +Z direction of the lid 120F. The first coil 142*b*, the second coil 144*b*, and the third coil 146*b* are attached to the circuit board 130A.

The fixed body 120 accommodates the circuit board 130 together with the movable body 110. The circuit board 130 is separated into two. The circuit board 130 includes the first circuit board 132 and the second circuit board 134. The first circuit board 132 and the second circuit board 134 are arranged symmetrically. Each of the first circuit board 132 and the second circuit board 134 has a bent portion bent in the Y direction.

Note that, in the above description with reference to FIGS. 3 to 15, each of the first circuit board 132 and the second circuit board 134 includes the third direction bent portion 132Y and the third direction bent portion 134Y. However, the present embodiment is not limited to this configuration. The first circuit board 132 and the second circuit board 134 may respectively include the first direction bend portion 132Z and the first direction bend portion 134Z without including the third direction bend portion 132Y and the third direction bend portion 134Y.

Figure 15:
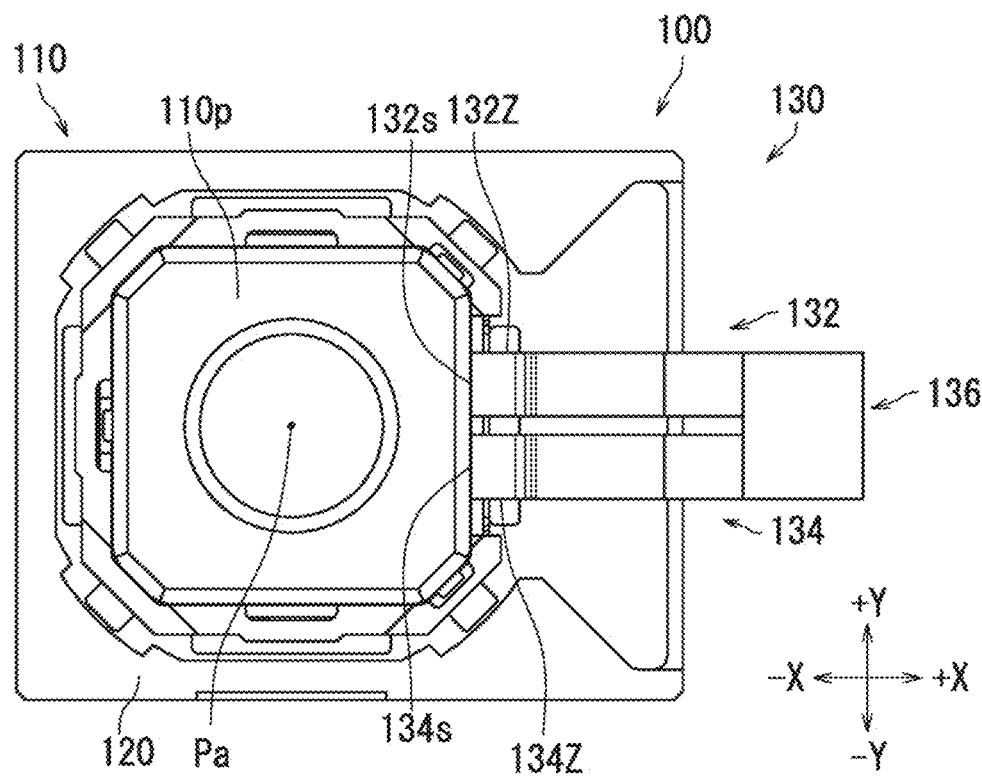
FIG. 15 is a schematic top view of the optical unit of the present embodiment.

Next, the optical unit 100 according to the present embodiment will be described with reference to FIGS. 15 and 16. FIG. 15 is a schematic top view of the optical unit 100 of the present embodiment, and FIG. 16 is a schematic perspective view of the circuit board 130 and the optical module 110*p* in the optical unit 100 of the present embodiment.

Figure 16:
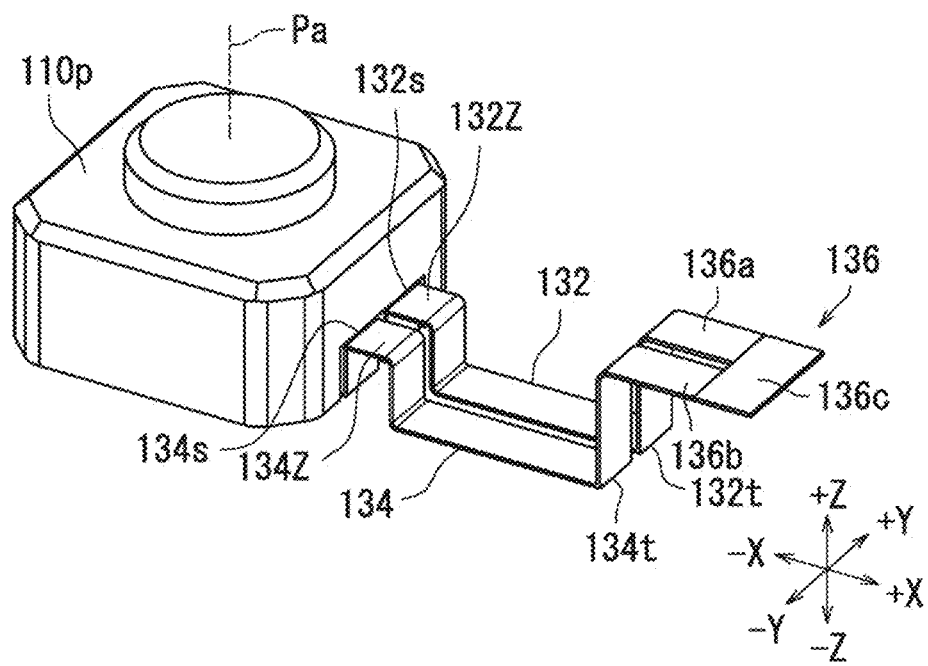
FIG. 16 is a schematic perspective view of the circuit board in the optical unit of the present embodiment.

As illustrated in FIGS. 15 and 16, the circuit board 130 includes the first circuit board 132 and the second circuit board 134.

The first circuit board 132 has the first direction extended first portion azp1, the first direction extended second portion azp2, and the first direction bent portion 132Z. The first direction extended first portion azp1 extends from the −Z direction side to the +Z direction side. The first direction extended second portion azp2 extends from the +Z direction side to the −Z direction side. The first direction bent portion 132Z is connected to each of an end portion on the +Z direction side of the first direction extended first portion azp1 and an end portion on the +Z direction side of the first direction extended second portion azp2.

The second circuit board 134 has the first direction extended first portion bzp1, the first direction extended second portion bzp2, and the first direction bent portion 134Z. The first direction extended first portion bzp1 extends from the −Z direction side to the +Z direction side. The first direction extended second portion bzp2 extends from the +Z direction side to the −Z direction side. The first direction bent portion 134Z is connected to each of an end portion on the +Z direction side of the first direction extended first portion bzp1 and an end portion on the +Z direction side of the first direction extended second portion bzp2.

The elastic resistance of the circuit board 130 can be reduced even in a case where the movable body 110 is rotated about the first rotation axis extending in the first direction.

In the first circuit board 132, the first direction extended first portion azp1 is connected to the movable body 110. The first direction bent portion 132Z extends from the −X direction side toward the +X direction side.

In the second circuit board 134, the first direction extended first portion bzp1 is connected to the movable body 110. The first direction bent portion 134Z extends from the −X direction side toward the +X direction side. Influence of the movement of the movable body 110 on the first circuit board 132 and the second circuit board 134 can be suppressed.

The distance from the second end portion 132*t* of the first circuit board 132 connected to the fixed body 120 to the first end portion 132*s* of the first circuit board 132 is equal to the natural length from the first end portion 132*s* of the first circuit board 132 to the second end portion 132*t*. The distance from the second end portion 134*t* of the second circuit board 134 connected to the fixed body 120 to the first end portion 134*s* of the second circuit board 134 is equal to the natural length from the first end portion 134*s* of the second circuit board 134 to the second end portion 134*t*.

Since the length of the first circuit board 132 connected to the fixed body 120 is equal to the natural length of the first circuit board 132, the first circuit board 132 can be connected to the fixed body 120 without causing stress. Further, since the length of the second circuit board 134 connected to the fixed body 120 is equal to the natural length of the second circuit board 134, the second circuit board 134 can be connected to the fixed body 120 without causing stress.

The optical unit 100 includes the shake correction unit 100A and the optical module 110p. In this manner, the elastic resistance of the circuit board 130 in the optical unit 100 can be reduced.

The smartphone 200 includes the optical unit 100 of the present embodiment. The elastic resistance of the circuit board 130 in the smartphone 200 can be reduced.

Note that while FIG. 1 illustrates the smartphone 200 as an example of the application of the optical unit 100 of the present embodiment, the application of the optical unit 100 is not limited to this. The optical unit 100 is preferably used for a digital camera or a video camera. For example, the optical unit 100 may be used as a part of a drive recorder. Alternatively, the optical unit 100 may be mounted on a camera for a flight vehicle (for example, a drone).

Note that, in the optical unit 100 and each member of the optical unit 100 illustrated in FIGS. 2 to 16, the movable body 110 has a substantially thin plate shape. However, the present embodiment is not limited to this configuration. The movable body 110 may have a substantially spherical shape, and the fixed body 120 may swingably support the movable body 110 according to the shape of the movable body 110.

The embodiment of the present invention has been described above with reference to the drawings. However, the present invention is not limited to the above embodiment, and can be implemented in various modes without departing from the gist of the invention. Further, various inventions are possible by appropriately combining the plurality of constituents disclosed in the above embodiment. For example, some constituents may be removed from all the constituents described in the embodiment. Furthermore, constituents across different embodiments may be combined as appropriate. The constituents in the drawings are mainly and schematically illustrated to facilitate better understanding, and the thickness, length, number, spacing, and the like of each constituent illustrated in the drawings may differ from actual values for the convenience of creating drawings. Additionally, the material, shape, dimension, and the like of each constituent element illustrated in the above embodiments are mere examples and are not particularly limited, and various modifications can be made without substantially departing from the effects of the present invention.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A shake correction unit that corrects a shake of an optical module having at least an imaging element, the shake correction unit comprising:
    a movable body;
    a fixed body that movably supports the movable body; and
    a circuit board connected to the movable body,
    wherein
    the movable body is rotatable about at least a first rotation axis extending in a first direction,
    the circuit board includes a first circuit board and a second circuit board,
    the first circuit board has
        a first end portion connected to the movable body on a first side in a second direction orthogonal to the first direction with respect to the movable body, and
        a second end portion that is connected to the fixed body,
    the second circuit board has
        a first end portion connected to the movable body on the first side in the second direction with respect to the movable body, and
        a second end portion that is connected to the fixed body,
    the first circuit board has
        a first portion extending from a first side in a third direction orthogonal to each of the first direction and the second direction to a second side in the third direction,
        a second portion extending from the second side in the third direction to the first side in the third direction, and
        a third direction bent portion in which an end portion on the second side in the third direction of the second portion is bent in the third direction with respect to an end portion on the second side in the third direction of the first portion, and
    the second circuit board has
        a first portion extending from the second side in the third direction to the first side in the third direction,
        a second portion extending from the first side in the third direction to the second side in the third direction, and
        a third direction bent portion in which an end portion on the first side in the third direction of the second portion is bent in the third direction with respect to an end portion on the first side in the third direction of the first portion.

2. The shake correction unit according to claim 1, wherein
    in the first circuit board,
        the first portion extends from a first side in the second direction and the first side in the third direction orthogonal to each of the first direction and the second direction to a second side in the second direction and the second side in the third direction,
        the second portion extends from the first side in the second direction and the second side in the third direction to the second side in the second direction and the first side in the third direction, and
        the third direction bent portion has an end portion on the first side in the second direction and on the second side in the third direction of the second portion bent in the third direction with respect to an end portion on the second side in the second direction and on the second side in the third direction of the first portion, and
    in the second circuit board,
        the first portion extends from the first side in the second direction and the second side in the third direction to the second side in the second direction and the first side in the third direction,
        the second portion extends from the first side in the second direction and the first side in the third direction to the second side in the second direction and the second side in the third direction, and
        the third direction bent portion has an end portion on the first side in the second direction and on the first side in the third direction of the second portion bent in the third direction with respect to an end portion on the second side in the second direction and on the first side in the third direction of the first portion.

3. The shake correction unit according to claim 1, wherein
a distance from the second end portion of the first circuit board connected to the fixed body to the first end portion of the first circuit board is equal to a natural length from the first end portion of the first circuit board to the second end portion, and
a distance from the second end portion of the second circuit board connected to the fixed body to the first end portion of the second circuit board is equal to a natural length from the first end portion of the second circuit board to the second end portion.

4. The shake correction unit according to claim 1, wherein
the first circuit board and the second circuit board are plane symmetric with respect to a reference plane having a normal extending in the third direction.

5. The shake correction unit according to claim 1, wherein
a straight line connecting a center along the third direction of the first end portion of the first circuit board and a center along the third direction of the second end portion of the first circuit board is parallel to a straight line connecting a center along the third direction of the first end portion of the second circuit board and a center along the third direction of the second end portion of the second circuit board.

6. The shake correction unit according to claim 1, wherein
the second end portion of the first circuit board is located on the second side in the second direction with respect to the first end portion of the first circuit board, and
the second end portion of the second circuit board is located on the second side in the second direction with respect to the first end portion of the second circuit board.

7. The shake correction unit according to claim 1, wherein
the third direction bent portion of the first circuit board has a fold, and
the third direction bent portion of the second circuit board has a fold.

8. The shake correction unit according to claim 1, wherein
the first circuit board is located on the second side in the third direction with respect to the second circuit board,
the third direction bent portion of the first circuit board includes
a first outer bent portion,
a first inner bent portion located closer to the second end portion than the first outer bent portion,
a second outer bent portion located closer to the second end portion than the first inner bent portion,
a second inner bent portion located closer to the second end portion than the second outer bent portion, and
a third outer bent portion located closer to the second end portion than the second inner bent portion, and
in the first circuit board, the second outer bent portion and the third outer bent portion are located further on the second side in the third direction than the first outer bent portion, and
the third direction bent portion of the second circuit board includes
a first outer bent portion,
a first inner bent portion located closer to the second end portion than the first outer bent portion,
a second outer bent portion located closer to the second end portion than the first inner bent portion,
a second inner bent portion located closer to the second end portion than the second outer bent portion, and
a third outer bent portion located closer to the second end portion than the second inner bent portion, and
in the second circuit board, the second outer bent portion and the third outer bent portion are located further on the first side in the third direction than the first outer bent portion.

9. The shake correction unit according to claim 1, wherein
the first circuit board has
a first direction extended first portion extending from a first side in the first direction to a second side in the first direction,
a first direction extended second portion extending from the second side in the first direction to the first side in the first direction, and
a first direction bent portion connected to each of an end portion on the second side in the first direction of the first direction extended first portion and an end portion on the second side in the first direction of the first direction extended second portion, and
the second circuit board has
a first direction extended first portion extending from the first side in the first direction to the second side in the first direction,
a first direction extended second portion extending from the second side in the first direction to the first side in the first direction, and
a first direction bent portion connected to each of an end portion on the second side in the first direction of the first direction extended first portion and an end portion on the second side in the first direction of the first direction extended second portion.

10. The shake correction unit according to claim 9, wherein
on the first circuit board,
the first direction extended first portion is connected to the movable body, and
the first direction bent portion extends from a first side in the second direction toward a second side in the second direction, and
on the second circuit board,
the first direction extended first portion is connected to the movable body, and
the first direction bent portion extends from the first side in the second direction toward the second side in the second direction.

11. The shake correction unit according to claim 1, wherein
the movable body has
a first and second main surfaces, and
a first side surface, a second side surface, a third side surface, and a fourth side surface that are connected to the first main surface and the second main surface,
the fixed body has
a first side portion facing the first side surface of the movable body,
a second side portion facing the second side surface of the movable body,
a third side portion facing the third side surface of the movable body, and
a fourth side portion facing the fourth side surface of the movable body,
the fourth side surface is located on a second side in the second direction of the movable body, and
the shake correction unit further includes
a first magnet arranged on the first side surface of the movable body,
a second magnet arranged on the second side surface of the movable body, a third magnet arranged on the third side surface of the movable body,
a first coil arranged on the first side portion of the fixed body,
a second coil arranged on the second side portion of the fixed body, and
a third coil arranged on the third side portion of the fixed body.

12. An optical unit comprising:
the shake correction unit according to claim 1; and
the optical module.

13. A smartphone comprising the optical unit according to claim 12.

14. A shake correction unit that corrects a shake of an optical module having at least an imaging element, the shake correction unit comprising:
a movable body;
a fixed body that movably supports the movable body; and
a circuit board connected to the movable body,
wherein
the movable body is rotatable about at least a first rotation axis extending in a first direction,
the circuit board includes a first circuit board and a second circuit board,
the first circuit board has
a first direction extended first portion extending from a first side in the first direction to a second side in the first direction,
a first direction extended second portion extending from the second side in the first direction to the first side in the first direction,
a first direction bent portion connected to each of an end portion on the second side in the first direction of the first direction extended first portion and an end portion on the second side in the first direction of the first direction extended second portion, and
a curved portion which has a curved structure curved to the first direction and is connected to an end portion of the first direction extended second portion, and
the second circuit board has
a first direction extended first portion extending from the first side in the first direction to the second side in the first direction,
a first direction extended second portion extending from the second side in the first direction to the first side in the first direction,
a first direction bent portion connected to each of an end portion on the second side in the first direction of the first direction extended first portion and an end portion on the second side in the first direction of the first direction extended second portion, and
a curved portion which has a curved structure curved to the first direction and is connected to an end portion of the first direction extended second portion.

15. The shake correction unit according to claim 14, wherein
on the first circuit board,
the first direction extended first portion is connected to the movable body, and
the first direction bent portion extends from a first side in a second direction orthogonal to the first direction toward a second side in the second direction, and
on the second circuit board,
the first direction extended first portion is connected to the movable body, and
the first direction bent portion extends from the first side in the second direction toward the second side in the second direction.

16. The shake correction unit according to claim 14, wherein
the first circuit board has
a first end portion connected to the movable body on a first side in a second direction with respect to the movable body, the second direction being orthogonal to the first direction, and
a second end portion that is connected to the fixed body,
the second circuit board has
a first end portion connected to the movable body on the first side in the second direction with respect to the movable body, and
a second end portion that is connected to the fixed body,
the first circuit board has
a first portion extending from the first side in the second direction and a first side in a third direction orthogonal to each of the first direction and the second direction to the second side in the second direction and a second side in the third direction,
a second portion extending from the first side in the second direction and the second side in the third direction to the second side in the second direction and the first side in the third direction, and
a third direction bent portion having an end portion on the first side in the second direction and on the second side in the third direction of the second portion bent in the third direction with respect to an end portion on the second side in the second direction and on the second side in the third direction of the first portion, and
the second circuit board has
a first portion extending from the first side in the second direction and the second side in the third direction to the second side in the second direction and the first side in the third direction,
a second portion extending from the first side in the second direction and the first side in the third direction to the second side in the second direction and the second side in the third direction, and
a third direction bent portion having an end portion on the first side in the second direction and on the first side in the third direction of the second portion bent in the third direction with respect to an end portion on the second side in the second direction and on the first side in the third direction of the first portion.

17. The shake correction unit according to claim 16, wherein
a distance from the second end portion of the first circuit board connected to the fixed body to the first end portion of the first circuit board is equal to a natural length from the first end portion of the first circuit board to the second end portion, and
a distance from the second end portion of the second circuit board connected to the fixed body to the first end portion of the second circuit board is equal to a natural length from the first end portion of the second circuit board to the second end portion.

18. A shake correction unit that corrects a shake of an optical module having at least an imaging element, the shake correction unit comprising:
a movable body;
a fixed body that movably supports the movable body; and
a circuit board connected to the movable body, wherein the movable body is rotatable about at least a first rotation axis extending in a first direction, the circuit board includes a first circuit board and a second circuit board, the first circuit board has
- a first direction extended first portion extending from a first side in the first direction to a second side in the first direction,
- a first direction extended second portion extending from the second side in the first direction to the first side in the first direction, and
- a first direction bent portion connected to each of an end portion on the second side in the first direction of the first direction extended first portion and an end portion on the second side in the first direction of the first direction extended second portion, the second circuit board has
- a first direction extended first portion extending from the first side in the first direction to the second side in the first direction,
- a first direction extended second portion extending from the second side in the first direction to the first side in the first direction, and
- a first direction bent portion connected to each of an end portion on the second side in the first direction of the first direction extended first portion and an end portion on the second side in the first direction of the first direction extended second portion, the first circuit board has
- a first end portion connected to the movable body on a first side in a second direction with respect to the movable body, the second direction being orthogonal to the first direction, and
- a second end portion that is connected to the fixed body, the second circuit board has
- a first end portion connected to the movable body on the first side in the second direction with respect to the movable body, and
- a second end portion that is connected to the fixed body, the first circuit board has
- a first portion extending from the first side in the second direction and a first side in a third direction orthogonal to each of the first direction and the second direction to the second side in the second direction and a second side in the third direction,
- a second portion extending from the first side in the second direction and the second side in the third direction to the second side in the second direction and the first side in the third direction, and
- a third direction bent portion having an end portion on the first side in the second direction and on the second side in the third direction of the second portion bent in the third direction with respect to an end portion on the second side in the second direction and on the second side in the third direction of the first portion, and the second circuit board has
- a first portion extending from the first side in the second direction and the second side in the third direction to the second side in the second direction and the first side in the third direction,
- a second portion extending from the first side in the second direction and the first side in the third direction to the second side in the second direction and the second side in the third direction, and
- a third direction bent portion having an end portion on the first side in the second direction and on the first side in the third direction of the second portion bent in the third direction with respect to an end portion on the second side in the second direction and on the first side in the third direction of the first portion.

* * * * *